(12) United States Patent
Lin

(10) Patent No.: US 7,868,687 B2
(45) Date of Patent: Jan. 11, 2011

(54) IDEAL-LIKE BAND-PASS FILTER AND SINGLE-FREQUENCY FILTER

(76) Inventor: Ming Hsiung Lin, 3F, No. 21, Lane 331, Mingde Rd., Beitou District, Taipei 112 (TW)

( * ) Notice: Subject to any disclaimer, the term of this patent is extended or adjusted under 35 U.S.C. 154(b) by 242 days.

(21) Appl. No.: 12/228,456

(22) Filed: Aug. 12, 2008

(65) Prior Publication Data

US 2010/0039172 A1 Feb. 18, 2010

(51) Int. Cl.
*H03B 1/00* (2006.01)
(52) U.S. Cl. .................................... 327/557
(58) Field of Classification Search ............... 327/551, 327/552, 553, 557
See application file for complete search history.

(56) References Cited

U.S. PATENT DOCUMENTS 7,002,417 B2 * 2/2006 Maunuksela et al. .......... 331/17
7,558,348 B1 * 7/2009 Liu et al. ..................... 375/346

* cited by examiner

Primary Examiner—Jeffrey S Zweizig

(57) ABSTRACT

A near ideal single frequency and band pass filter comprises an input unit, a filter combination, and an output unit. The input unit accepts an input signal which can be expressed with a mathematical formula f(t). The filter combination comprises a plurality of filters, wherein each filter can generate a control signal and performs the signal filtering process based on the control signal. The control signal can be expressed with a mathematical formula hde(θ). The filter combination processes the input signal based on a set of a plurality of control signals by means of a formula.

10 Claims, 17 Drawing Sheets

IDEAL-LIKE BAND-PASS FILTER AND SINGLE-FREQUENCY FILTER

BACKGROUND OF INVENTION

1. Field of the Invention

The present invention refers to a filter and a method for filtering communication signals, and more particularly to an ideal-like band-pass filter and single-frequency filter which is characterized in Frequency Response Formula and Phase-Shift Response Formula.

2. Description of the Prior Art

For those conventional filters, no matter analog (not periodical) or digital (periodical), their frequency response formulae and phase-shift response formulae always generate different amplitudes of vibrations and different phase-shifts according to different frequencies of sine signals.

Conventional methods for designing filters mostly are related to the application of differential or difference equations. Firstly, a linear system representing the relationship between input and output signals is established, and then the output signal of this system can be calculated. This system can be established by electric circuitries, but also can be simulated by mathematics. Because the operations of circuitries (or operations of mathematical simulations) in the system always involve in actions of delayed signals (or advanced signals), which are actually resulted from the operations of capacitors (or inductors). That's why conventional filters always generate different amplitudes of vibrations and different phase-shifts according to different frequencies of sine signals.

Until now, the ways to avoid the phenomenon of aforementioned variations of amplitudes and phase-shifts are still focal points in designing the filters.

In addition, for conventional band-pass filters, the leading and rear edges of each curve of responsive frequency formulae are still not steep enough, which result in unclear borderlines between the responsive frequencies and the unresponsive frequencies, and thus require further improvements.

SUMMARY OF INVENTION

One objective of the present invention is to provide an ideal-like filter and a method for filtering communication signals, which is characterized in Frequency Response Formula and Phase-Shift Response Formula. For band-pass filters, the height of each top point in a range of responsive frequency is almost equal to 1 (where the error can be controlled to be less than $\pm 10^{-4}$). And, the width between the responsive frequency and the unresponsive frequency is also very narrow at the leading and rear edges of each curve of responsive frequency. For single-frequency filters, the range of responsive frequency is very narrow that it just likes a pulse wave having a height equal to 1. For both band-pass and single-frequency filters, their response formulae are equal to zero (absolute zero), such that no phase-shift will occur no matter what their frequencies are. Therefore, the filter in accordance with the present invention can be considered "ideal-like".

In order to achieve the aforementioned objective, the present invention discloses a filter for filtering communication signals, which comprises:

an input unit for accepting an input signal which can be expressed with a mathematical formula $f(t)$;

a filter combination which further comprising a plurality of filters, each filter being able to generate a control signal and perform a signal filtering process based on the control signal, the control signal being expressed with a mathematical formula $hde(\theta)$; wherein, the filter combination processes the input signal based on a set of a plurality of control signals by means of the following formula:

$$GL(t, v_1 \sim v_m; u_1 \sim u_n, S) = \begin{cases} GS(t, v_1 \sim v_m); & S = 1 \\ \overline{GS}(t, u_1 \sim u_n); & S = 2 \\ GS(t, v_1 \sim v_m)\overline{GS}(t, u_1 \sim u_n); & S \neq 1, 2; \end{cases}$$

(i) when $S = 1$, calculate: $[GL(t; v_1 \sim v_m; u_1 \sim u_n; S)]^{\frac{1}{m}}$;

(ii) when $S = 2$, calculate: $[GL(t; v_1 \sim v_m; u_1 \sim u_n; S)]^{\frac{1}{n}}$;

(iii) when $S \neq 1, 2$, calculate: $[GL(t; v_1 \sim v_m; u_1 \sim u_n; S)]^{\frac{1}{m+n}}$;

wherein, $G_r(t, v) = Fl\{f(t), hde(\theta); v\}$;

$\overline{G_r}(t, v) = Fl\{f(t), \overline{hde}(\theta); v\}$;

$G_s(t, v_1 \sim v_m) = \prod_{i=1}^{m} G_r(t, v_i)$;

$\overline{G_s}(t, u_1 \sim u_n) = \prod_{i=1}^{n} \overline{G_r}(t, u_i)$;

wherein, $v_1 \sim v_m$ and $u_1 \sim u_n$ are practice values for v of each filter of the filter combination, $\overline{hde}(\theta) = 1 - hde(\theta)$; and an output unit for outputting an output signal which can be expressed with the mathematical formula $GL(t, v_1 \sim v_m; u_1 \sim u_n, S)$.

In a preferred embodiment, wherein:

$$hde(\theta) = A_0 + \sum_{n=1}^{k} [A_n \cos(n\theta)];$$

$A_n$ (n=0, 1, . . . , k; where k is a positive integral) is a constant;

the filter can perform signal processes to a sine signal $S(\omega,t)$ by means of the following formula:

$$Sde(\omega, t_0) = S(\omega, t_0)\left[A_0 + \sum_{n=1}^{k} A_n \cos\left(\frac{n}{v}\omega\right)\right]$$

$$= S(\omega, t_0)hde\left(\frac{\omega}{v}\right)$$

$$= Fl\{S(\omega, t_0), hde(\theta); v\};$$

wherein, the value of $A_n$ of the above equation is equal to the value of $A_n$ of $hde(\theta)$, in addition, $$v = \frac{\omega}{\theta},$$

and $\theta$ is a constant.

In a preferred embodiment, wherein the constant value of $A_n$ can be obtained by means of calculation using the following steps:

firstly, generating a mated square-wave signal having a period of $2\pi$ and height of 1, the mated square-wave signal being mathematically represented by the following equation:

$$he(r, \theta) = \begin{cases} 1 & ; \quad 2p\pi - r\pi \le \theta \le 2p\pi + r\pi \\ 0 & ; \quad \theta = \text{others} \end{cases} \quad (1)\text{-}1$$

wherein, $$0 < r \le \frac{1}{2}; \rho = 0, \pm 1, \pm 2, \ldots \ ;$$

secondly, using Fourier transform to extend he(r,θ) to item k+1 (i.e., the item having an average value r), and letting it be hse(k,r,θ), and then obtaining:

$$hse(k, r, \theta) = r + \sum_{u=1}^{k} a_u \cos(k\theta); \quad (1)\text{-}2$$

wherein, r is average value, and $$a_u = \frac{2}{k\pi} \sin(2ru\pi);$$

thirdly, letting $$k = 5, r = \frac{1}{2},$$

and inputting them into equation (1)-2, and then letting:

$$hde(\theta) = \left\{ \left[ hse\left(5, \frac{1}{2}, \theta\right) \right]^3 - 1 \right\}^7 + 1;$$

therefore, the constant value of $A_n$ of hde(θ) being obtained.

In a preferred embodiment, wherein a calculation of GL(t; 7v;v,7v−2εv;3) can be achieved by performing filtering calculations of $\overline{G_r}(t,v)$, $\overline{G_r}(t,7v-2\epsilon v)$ and $G_r(t,7v)$; when εv=1, the calculation of GL(t;7v;v,7v−2εv;3) is a single-frequency filter.

In a preferred embodiment, wherein the filter can perform signal processes to the input signal f(t) by using the following mathematic function:

$$Fl\{f(t_0), hde(\theta); v\} = \sum_{i=1}^{m} \left[ S(\omega_i, t_o) hde\left(\frac{\omega_i}{v}\right) \right];$$

wherein, $$f(t) = \sum_{i=1}^{m} S(\omega_i, t).$$

In order to achieve the aforementioned objective, the present invention discloses a method for filtering communication signals, which comprises:

using an input unit to accept an input signal, the input signal can be expressed by a mathematical formula f(t);

using a filter combination for generating a set of a plurality of control signals, and performing a signal filtering process based on the control signals; the control signals being expressed with a mathematical formula hde(θ); wherein, the filter combination processes the input signal based on the control signals by means of the following formula:

$$GL(t, v_1 \sim v_m; u_1 \sim u_n, S) = \begin{cases} GS(t, v_1 \sim v_m); & S = 1 \\ GS(t, u_1 \sim u_n); & S = 2 \\ GS(t, v_1 \sim v_m)\overline{GS}(t, u_1 \sim u_n); & S \ne 1, 2; \end{cases}$$

(i) when $S = 1$, calculate: $[GL(t; v_1 \sim v_m; u_1 \sim u_n; S)]^{\frac{1}{m}}$;

(ii) when $S = 2$, calculate: $[GL(t; v_1 \sim v_m; u_1 \sim u_n; S)]^{\frac{1}{n}}$;

(iii) when $S \ne 1, 2$, calculate: $[GL(t; v_1 \sim v_m; u_1 \sim u_n; S)]^{\frac{1}{m+n}}$;

wherein, $$G_r(t, v) = Fl\{f(t), hde(\theta); v\};$$

$$\overline{G_r}(t, v) = Fl\{f(t), \overline{hde}(\theta); v\};$$

$$G_s(t, v_1 \sim v_m) = \prod_{i=1}^{m} G_r(t, v_i);$$

$$\overline{G_s}(t, u_1 \sim u_n) = \prod_{i=1}^{n} \overline{G_r}(t, u_i);$$

wherein, $v_1 \sim v_m$ and $u_1 \sim u_n$ are practice values for v of each filter of the filter combination, $\overline{hde}(\theta) = 1 - hde(\theta)$; and using an output unit for outputting an output signal which can be expressed with the mathematical formula GL(t,$v_1 \sim v_m$; $u_1 \sim u_n$,S).

BRIEF DESCRIPTION OF THE DRAWINGS

The details of the present invention will be more readily understood from a detailed description of the preferred embodiments taken in conjunction with the following figures.

according to the present invention.

Figure 3:
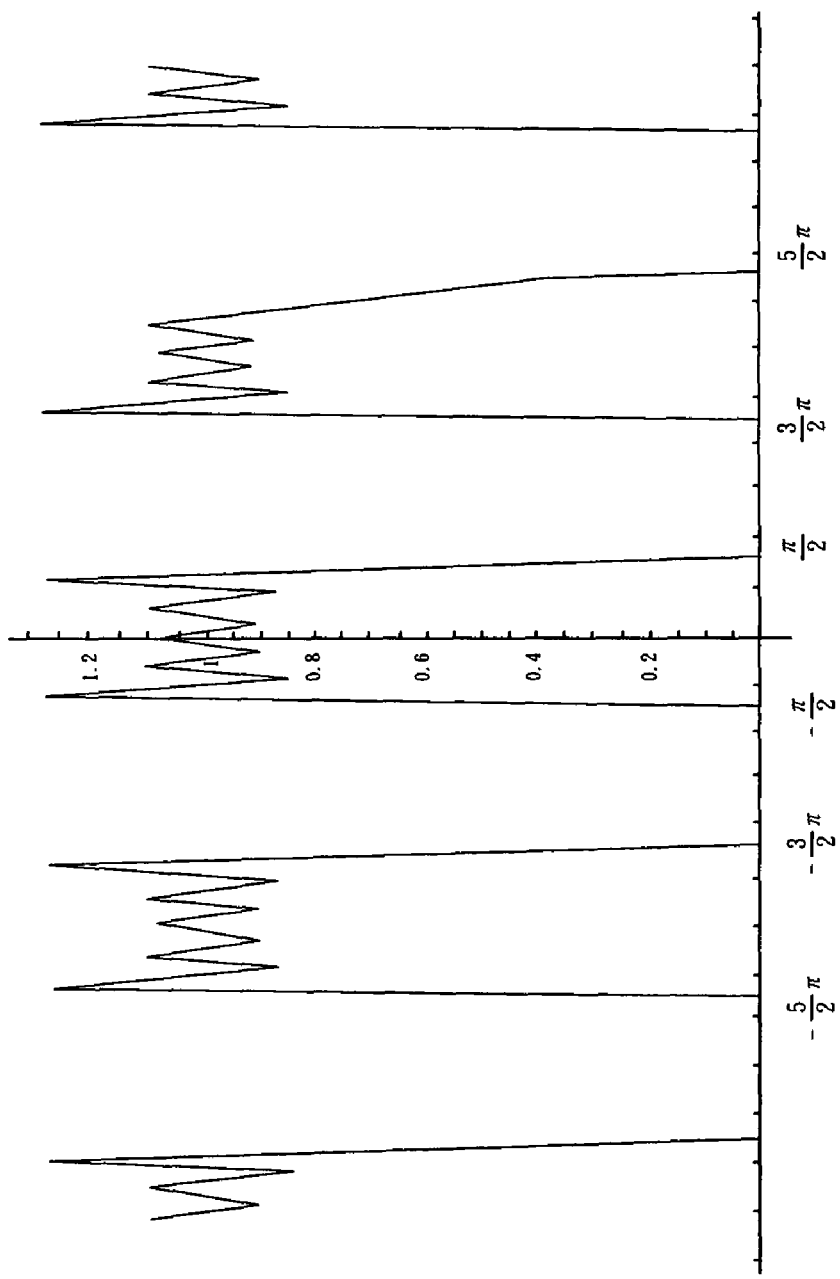

FIG. 3 shows a diagram of wave form obtained based on the function $$\left[ hse\left(5, \frac{1}{2}, \theta\right) \right]^3$$

according to the present invention.

Figure 4:
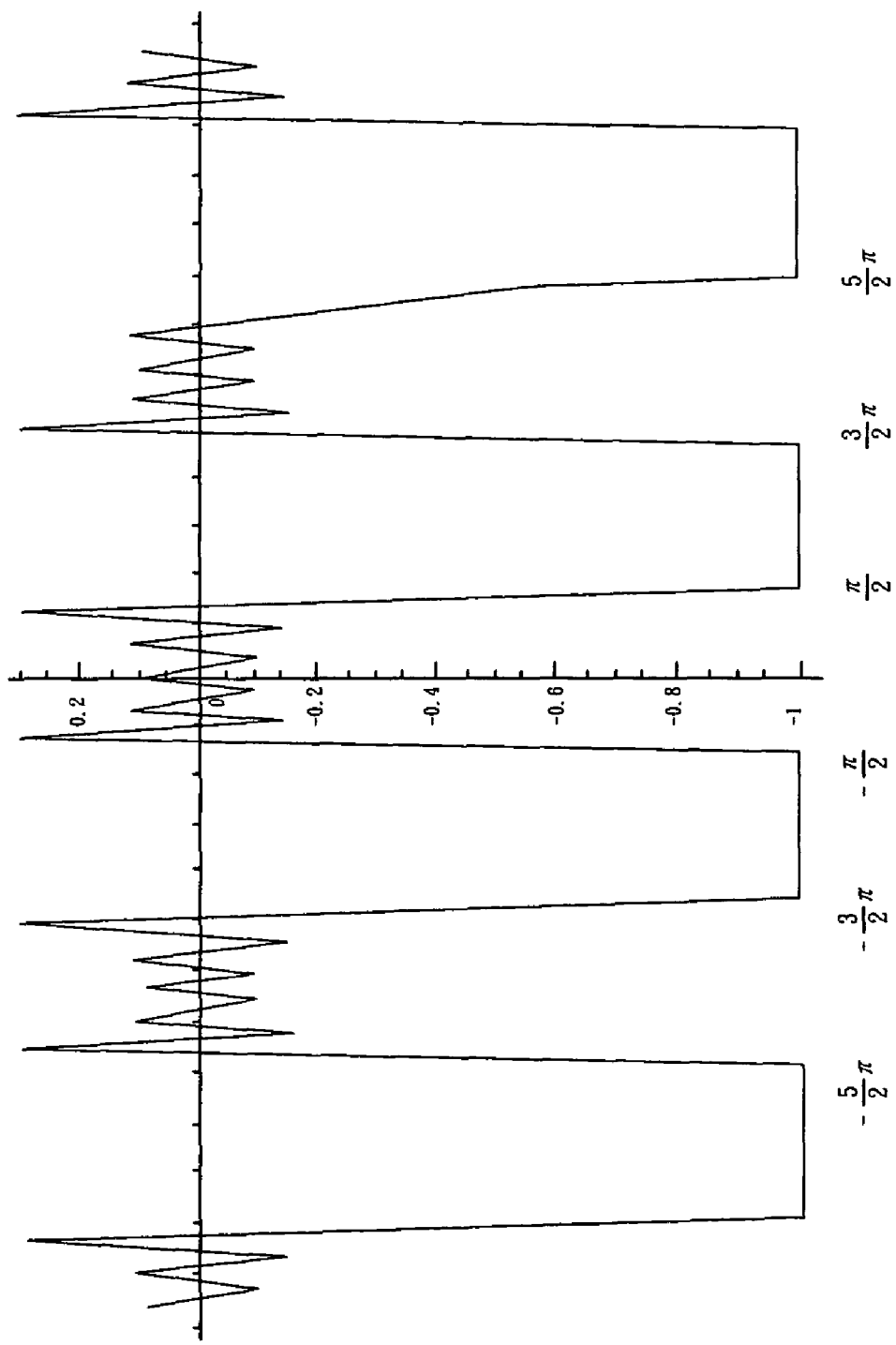

FIG. 4 shows a diagram of wave form obtained based on the function $$\left[ hse\left(5, \frac{1}{2}, \theta\right) \right]^3 - 1$$

according to the present invention.

Figure 5:
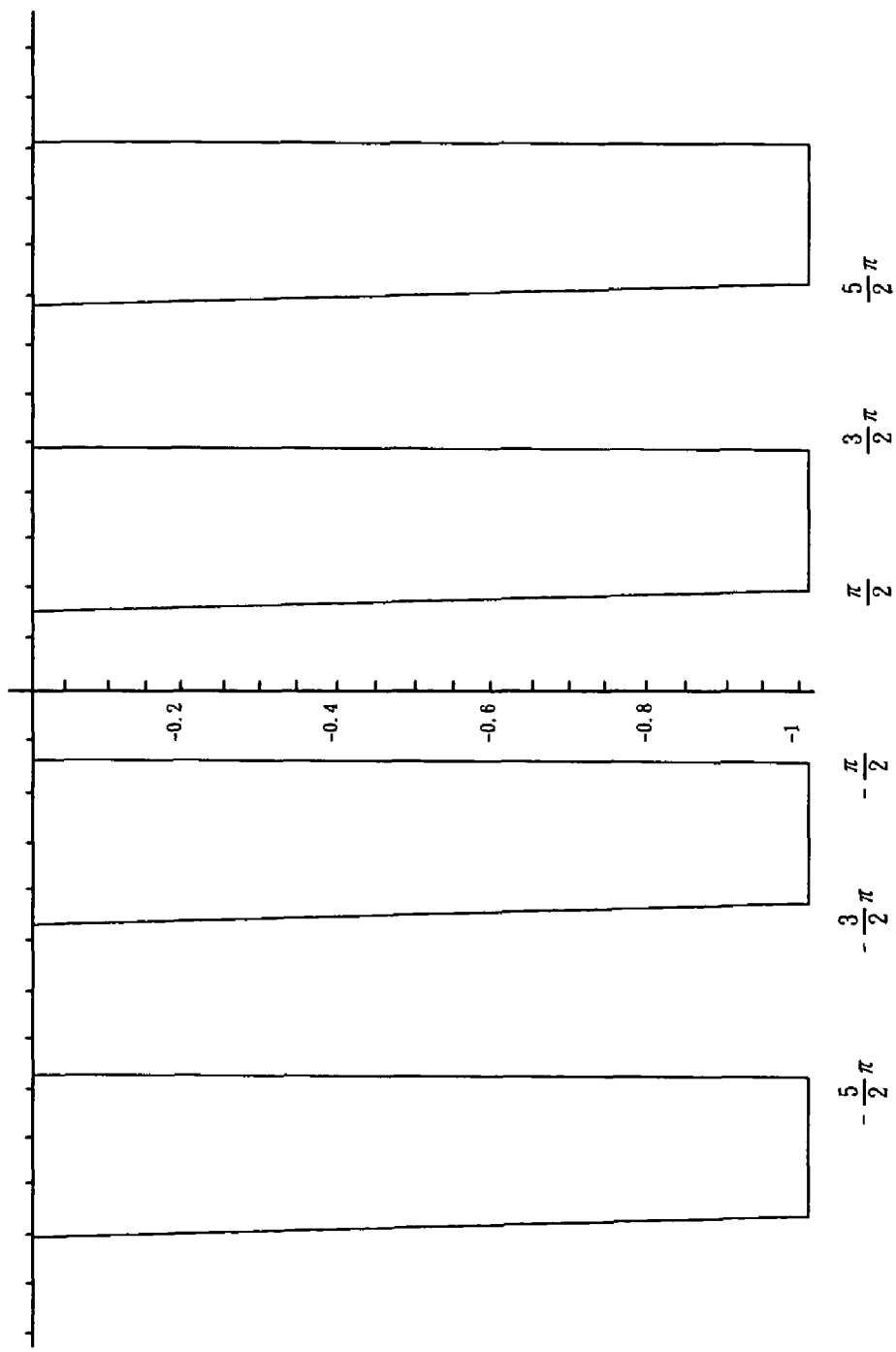

FIG. 5 shows a diagram of wave form obtained based on the function $$\left\{\left[hse\left(5, \frac{1}{2}, \theta\right)\right]^3 - 1\right\}^7$$

according to the present invention.

Figure 6:
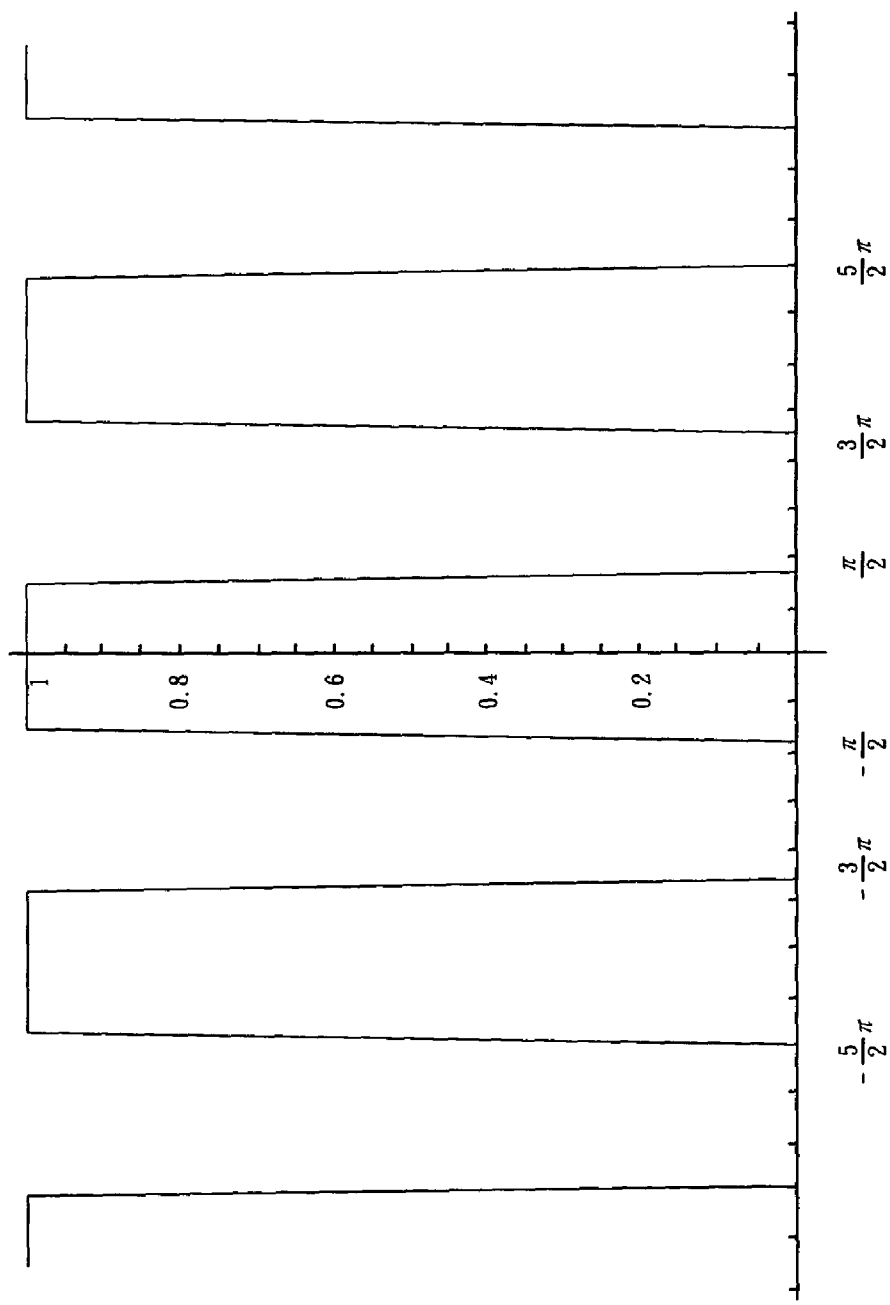

FIG. 6 shows a diagram of wave form obtained based on the function $$\left\{\left[hse\left(5, \frac{1}{2}, \theta\right)\right]^3 - 1\right\}^7 + 1$$

according to the present invention.

Figure 7:
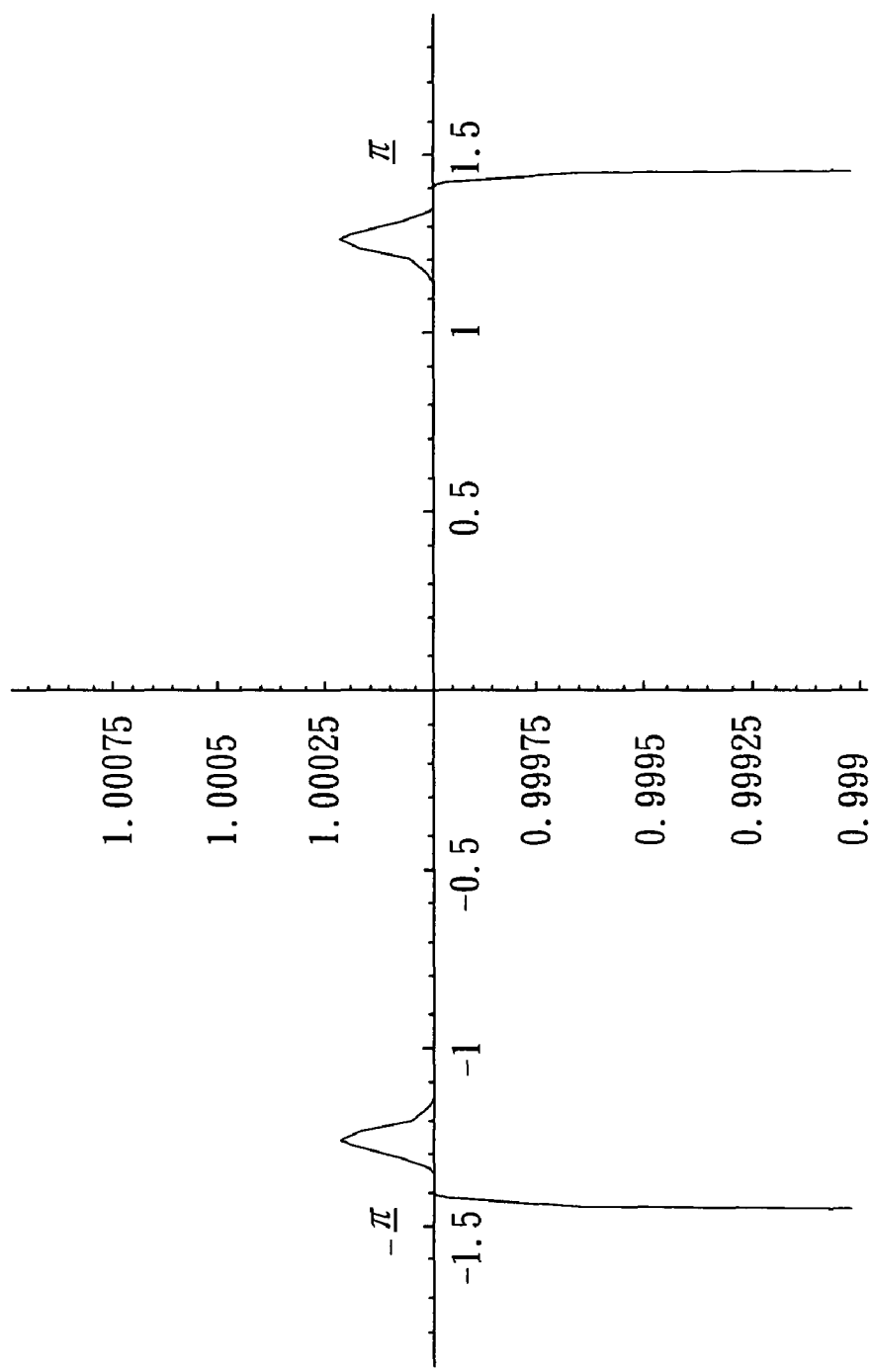

FIG. 7 is an enlarged view of FIG. 6 showing the wave form in the range that when θ is within the range of $$\left[2\rho\pi - \frac{1}{2}\pi, 2\rho\pi + \frac{1}{2}\pi\right].$$

Figure 8:
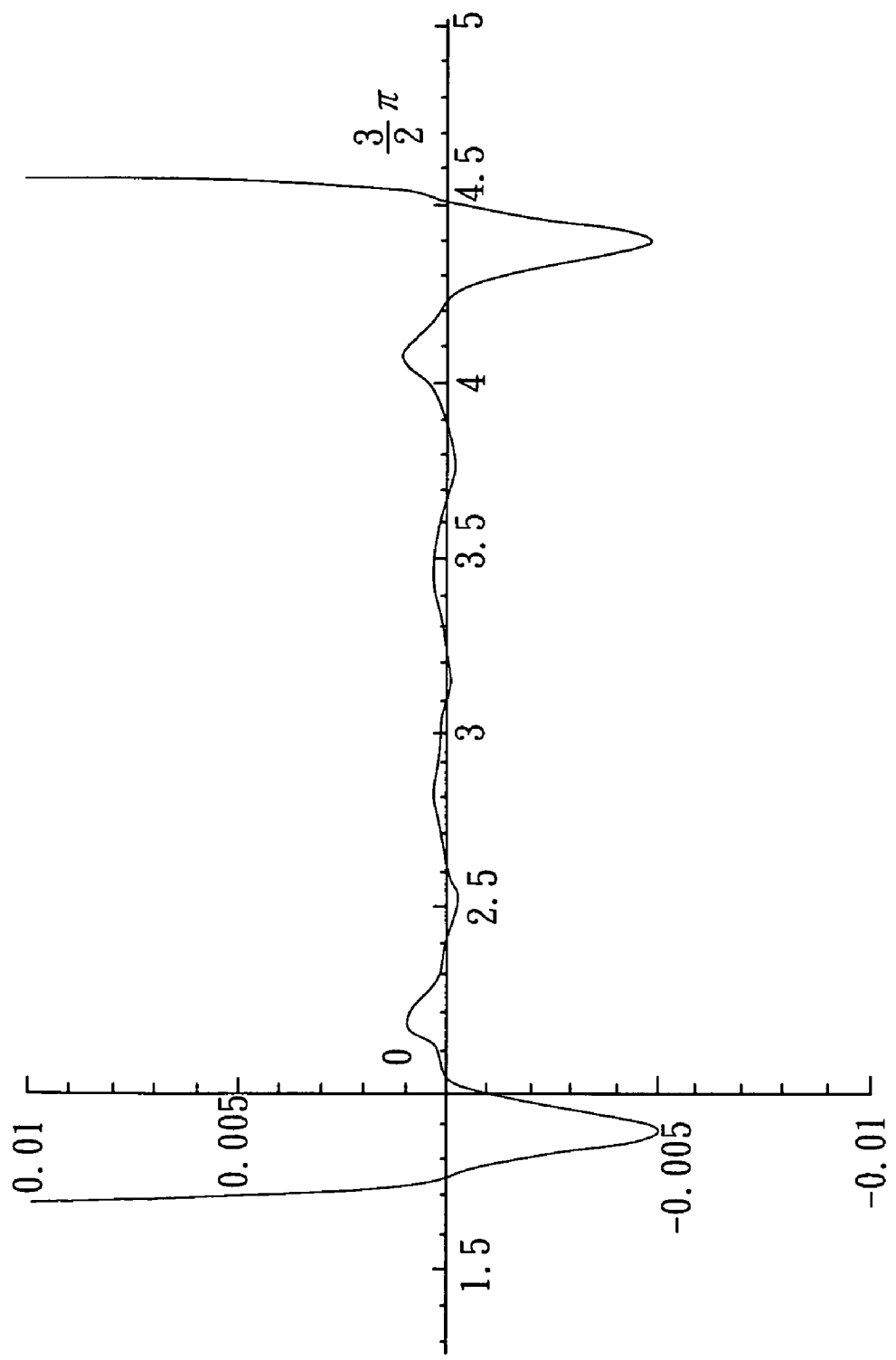

FIG. 8 is an enlarged view of FIG. 6 showing the wave form in the range that when θ is outside the range of $$\left[2\rho\pi - \frac{1}{2}\pi, 2\rho\pi + \frac{1}{2}\pi\right].$$

Figure 9:
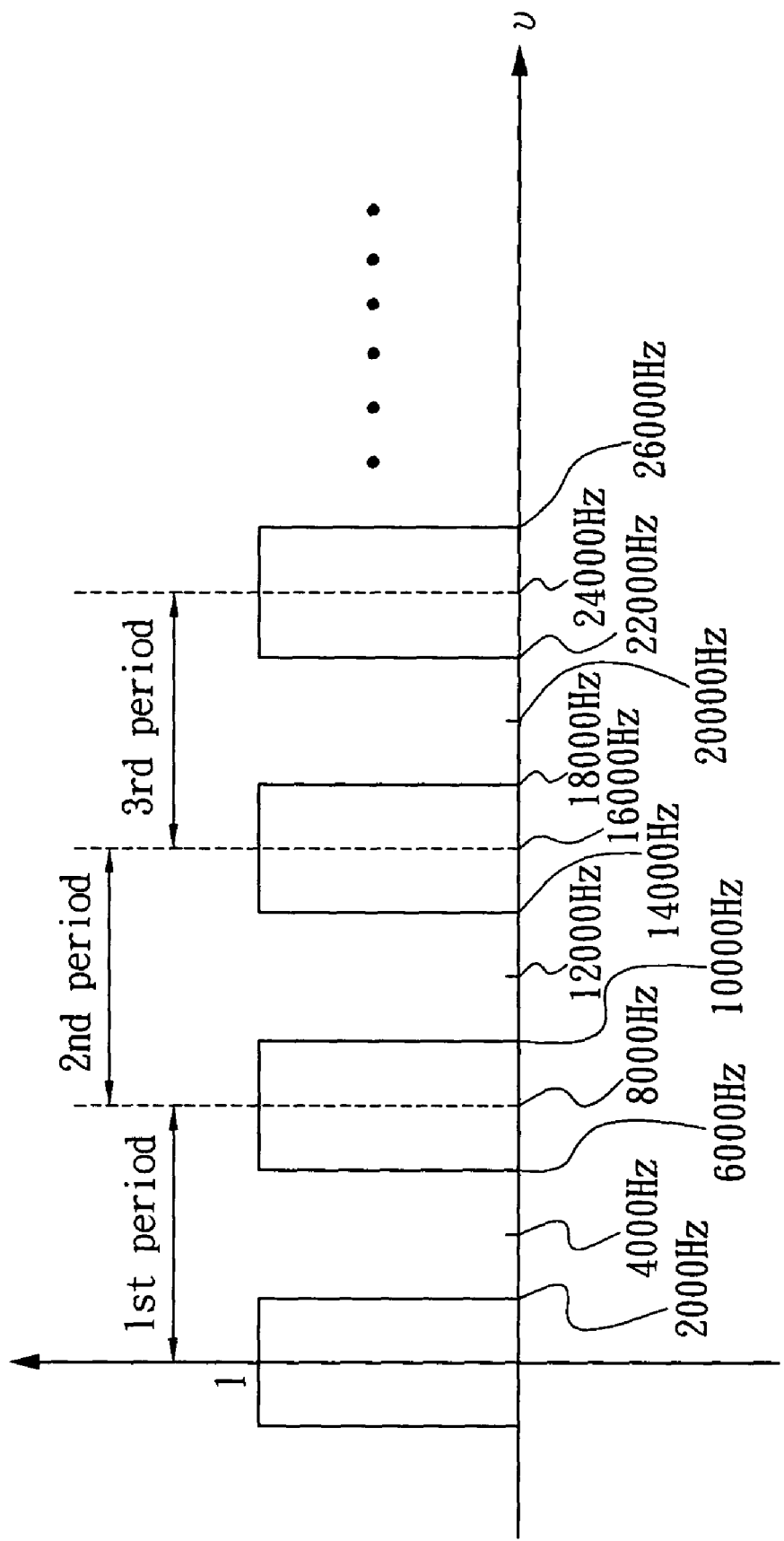

FIG. 9 shows a frequency response diagram of function hde(θ) when v=8000 Hz according to the present invention.

Figure 10:
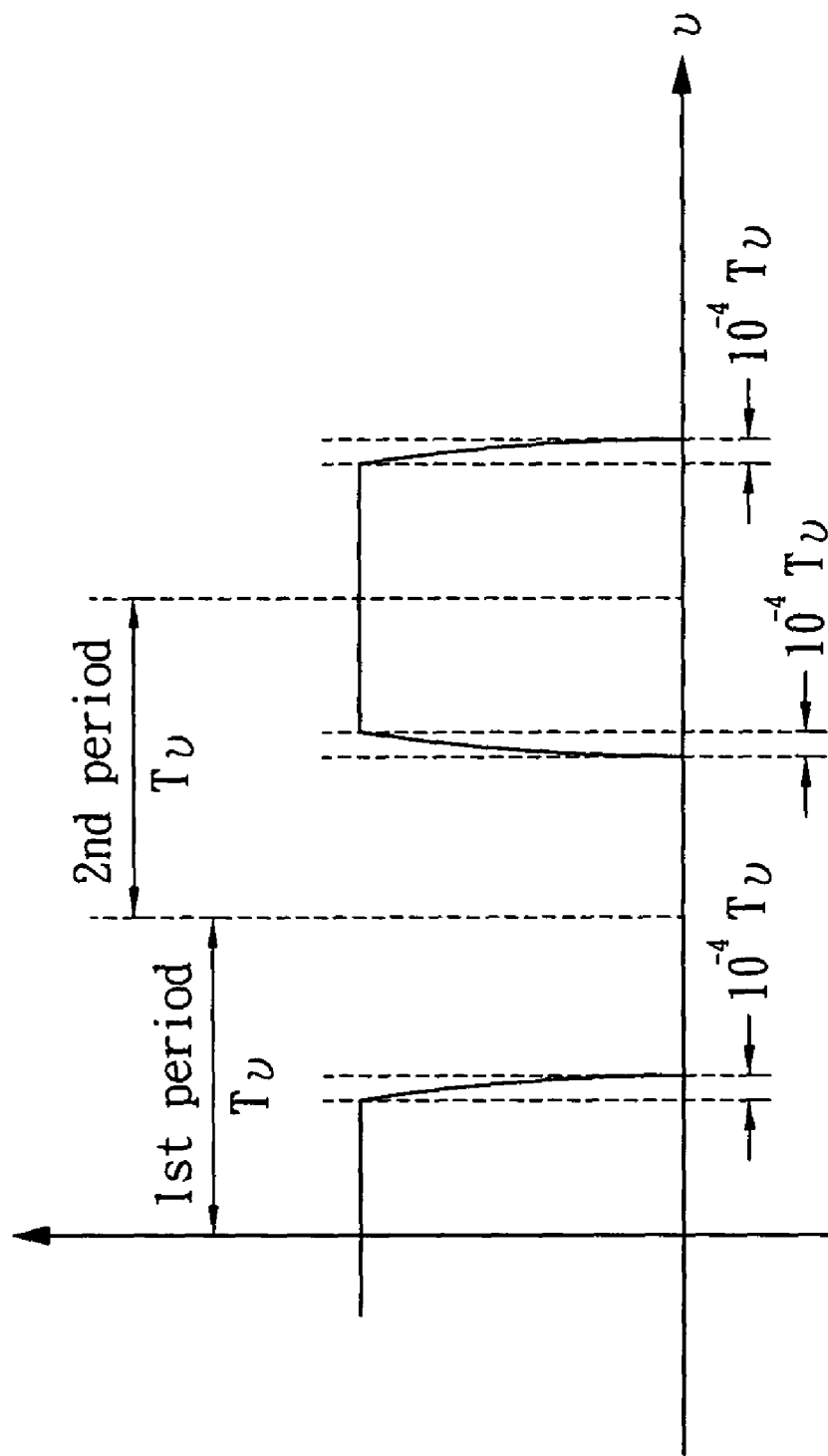

FIG. 10 shows a frequency response diagram of function hde(θ) according to the present invention.

Figure 11:
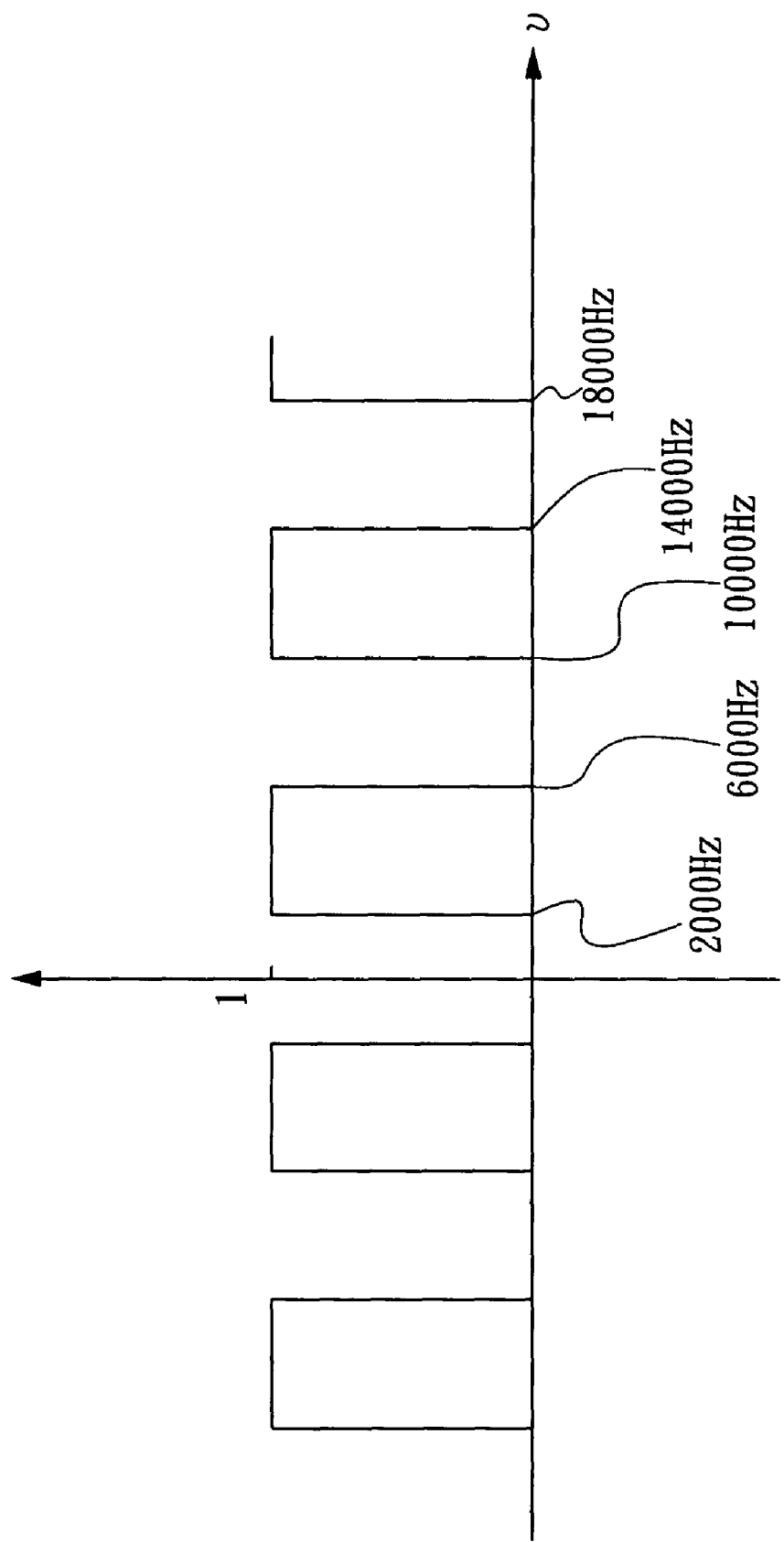

FIG. 11 shows a frequency response diagram of function $\overline{hde}$(θ) according to the present invention.

Figure 12:
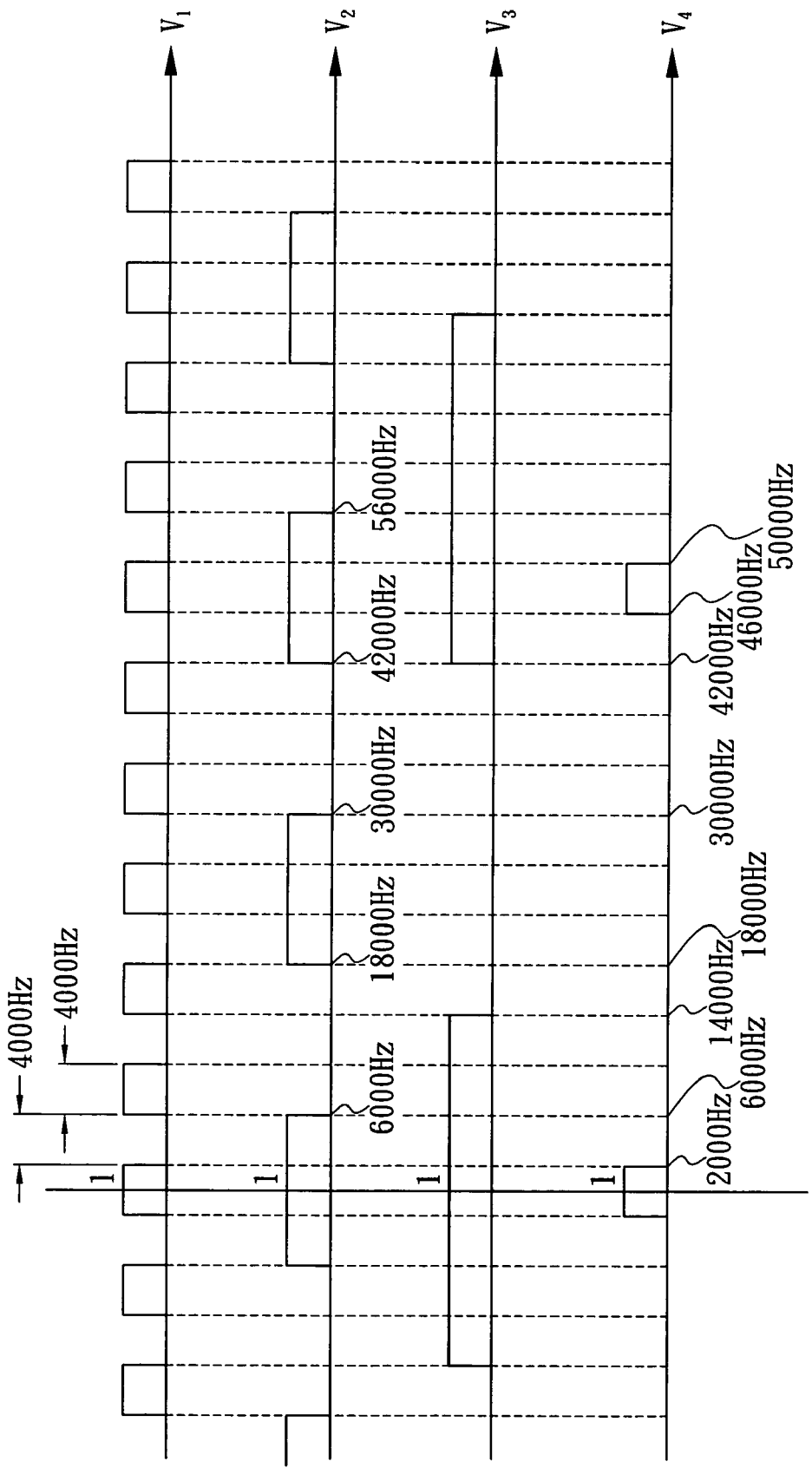

FIG. 12 shows a frequency response diagram according to functions Fl{f(t₀),hde(θ);8000}, Fl{f(t₀),hde(θ),12000}, Fl{f(t₀),hde(θ);28000}, and G₁(t₀)=Fl{f(t₀),hde(θ); 8000}Fl{f(t₀),hde(θ);12000}Fl{f(t₀),hde(θ);28000} of the present invention.

Figure 13:
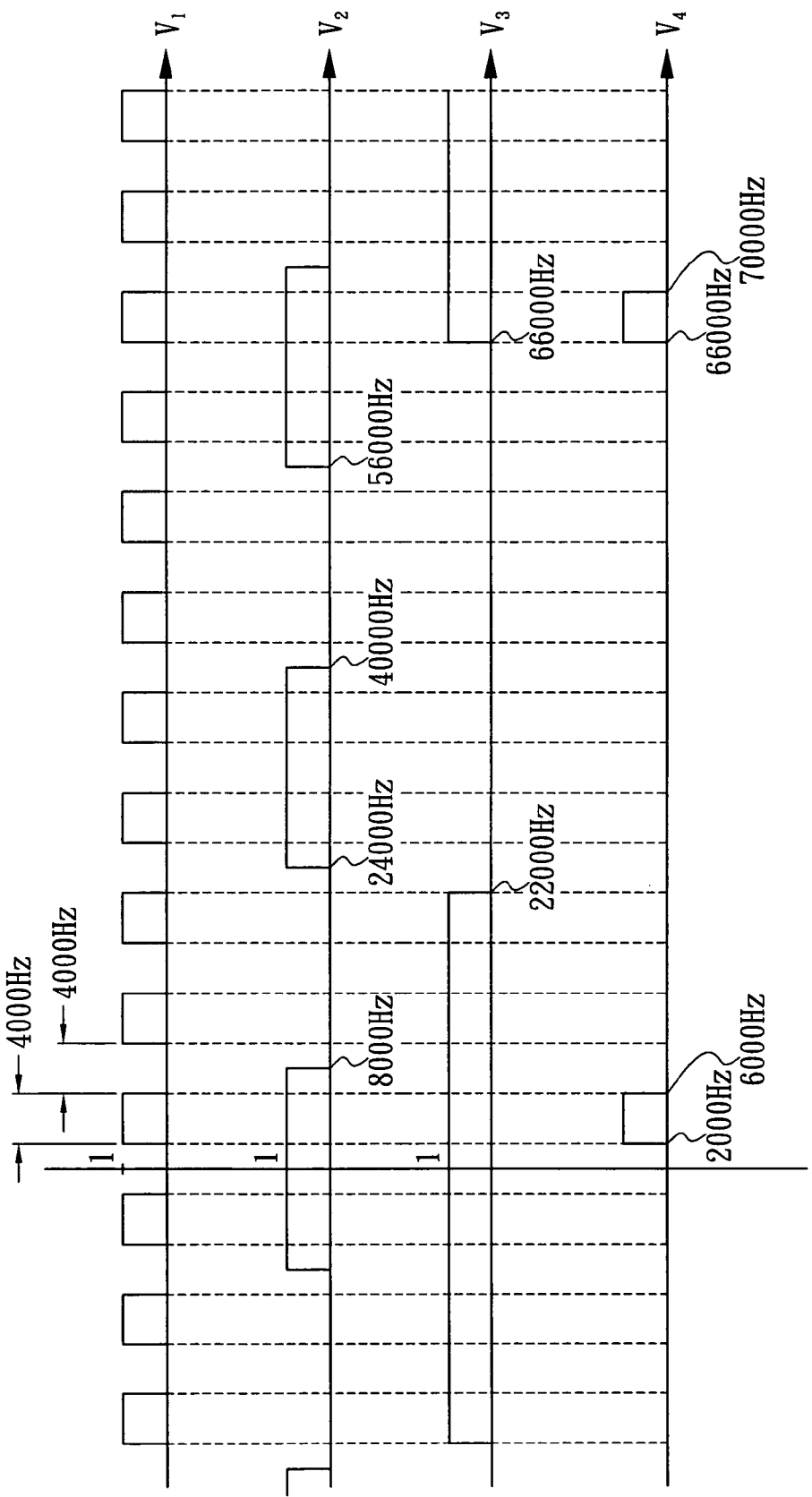

FIG. 13 shows a frequency response diagram according to functions Fl{f(t₀),$\overline{hde}$(θ);8000}, Fl{f(t₀),hde(θ);16000}, Fl{f(t₀),hde(θ);44000}, and G₂(t₀)=Fl{f(t₀), $\overline{hde}$(θ);8000}Fl{f(t₀),hde(θ);16000}Fl{f(t₀),hde(θ);44000} of the present invention.

Figure 14:
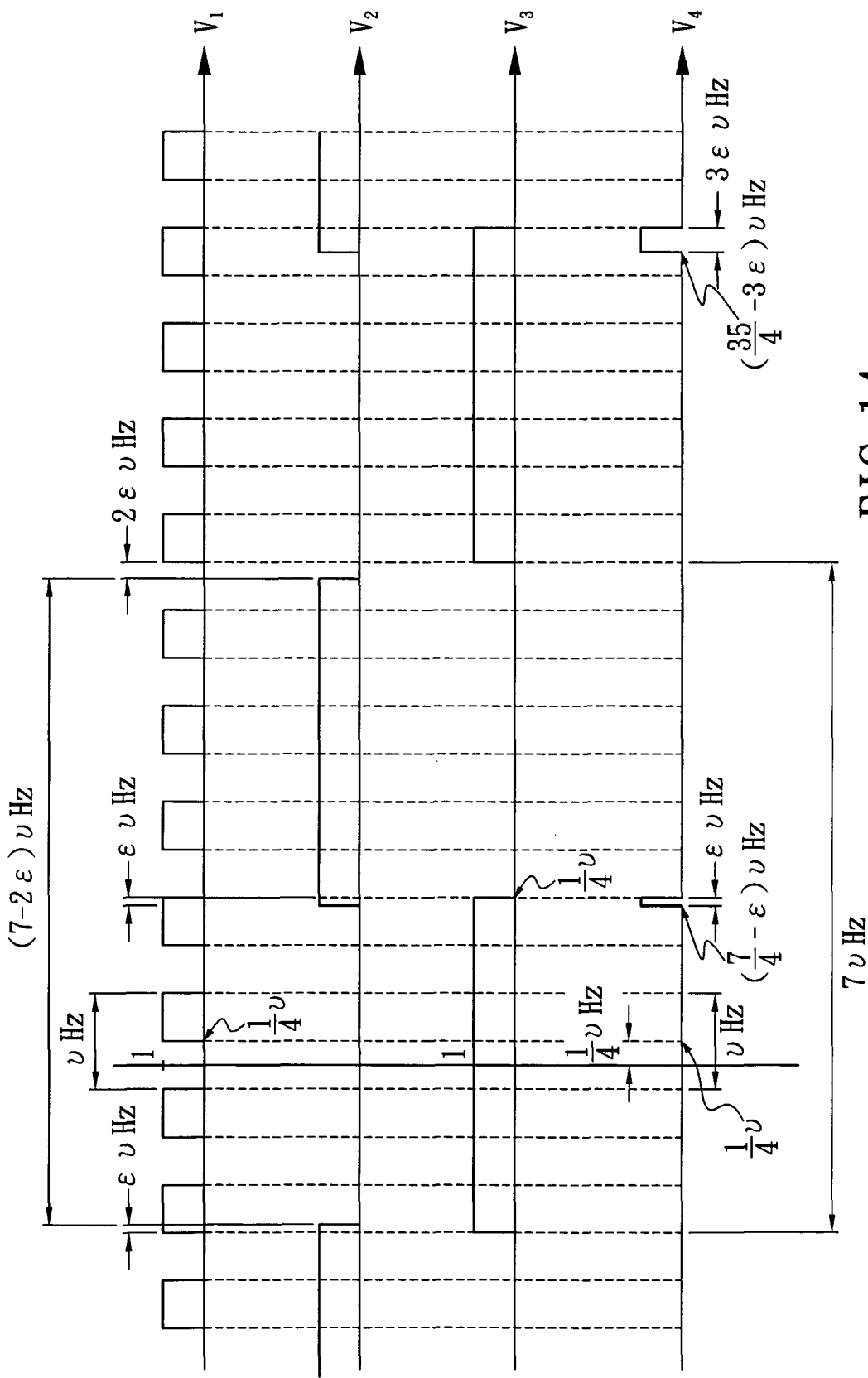

FIG. 14 shows a frequency response diagram according to functions $\overline{G_r}$(t,v), $\overline{G_r}$(t,7v−2εv), G_r(t,7v), and GL(t;7v;v,7v−2εv;3) of the present invention.

Figure 15:
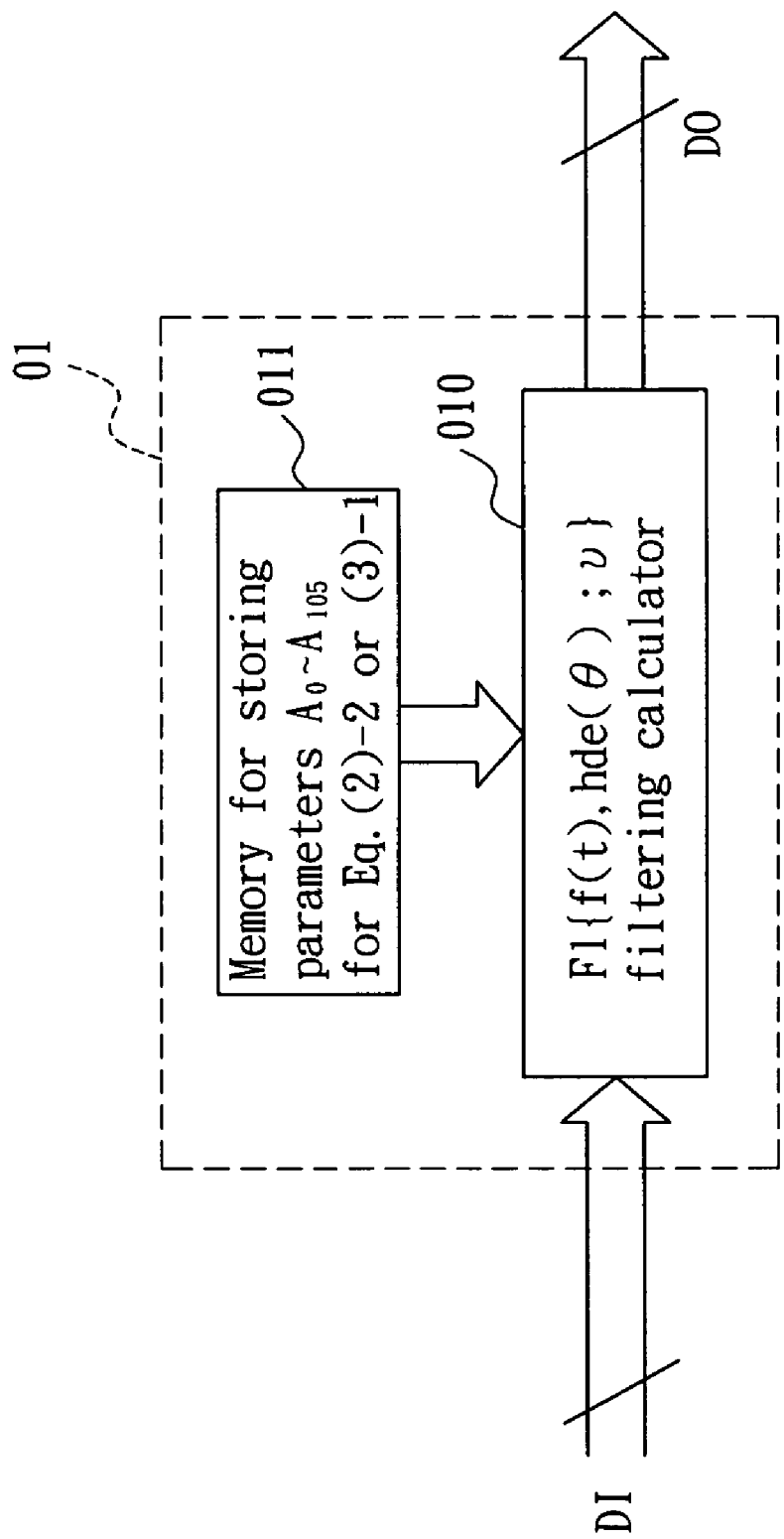

FIG. 15 shows a block diagram of the ideal-like single-frequency filter according to a preferred embodiment of the present invention.

Figure 16:
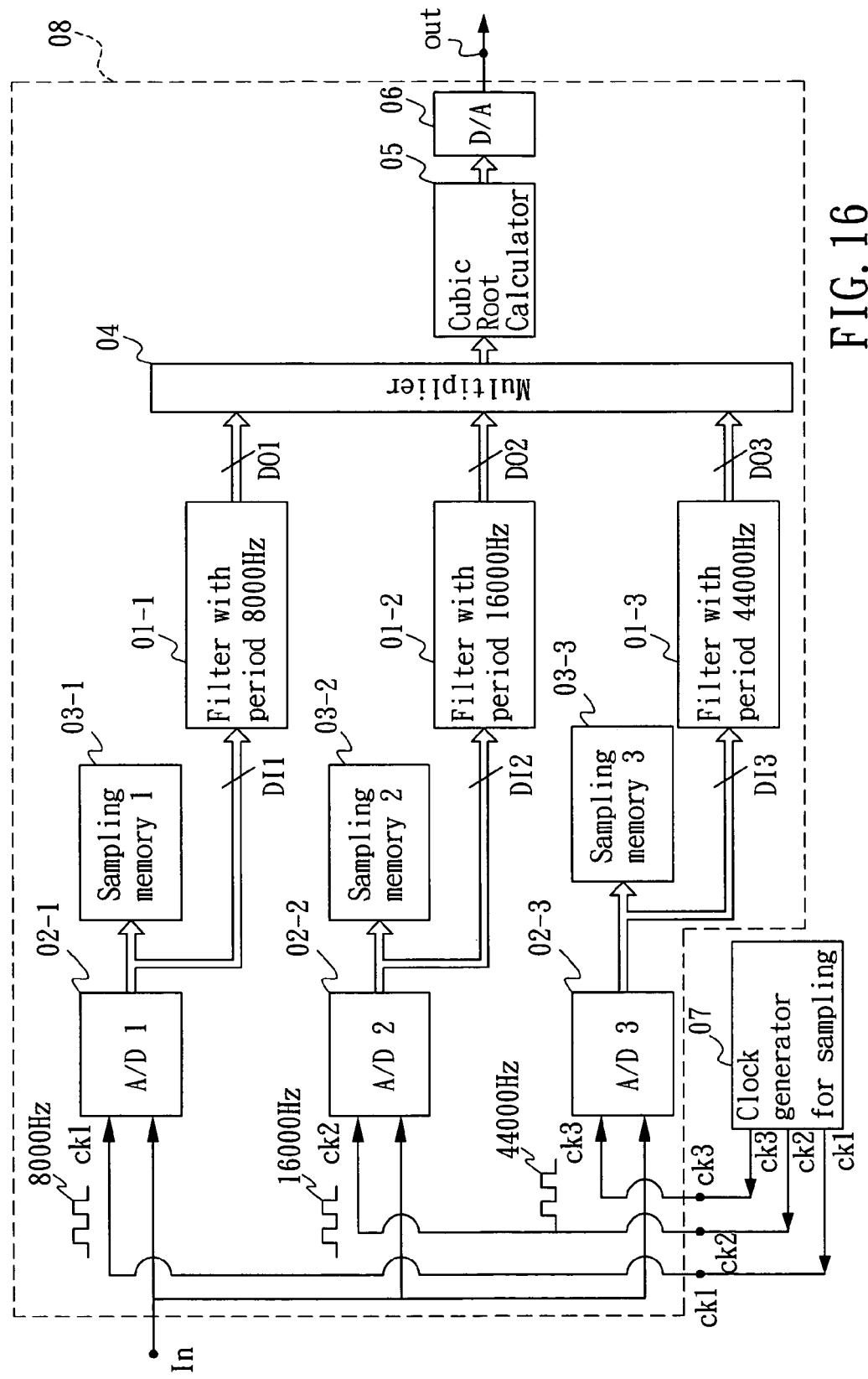

FIG. 16 shows a block diagram of the ideal-like band-pass filter according to a preferred embodiment of the present invention.

Figure 17:
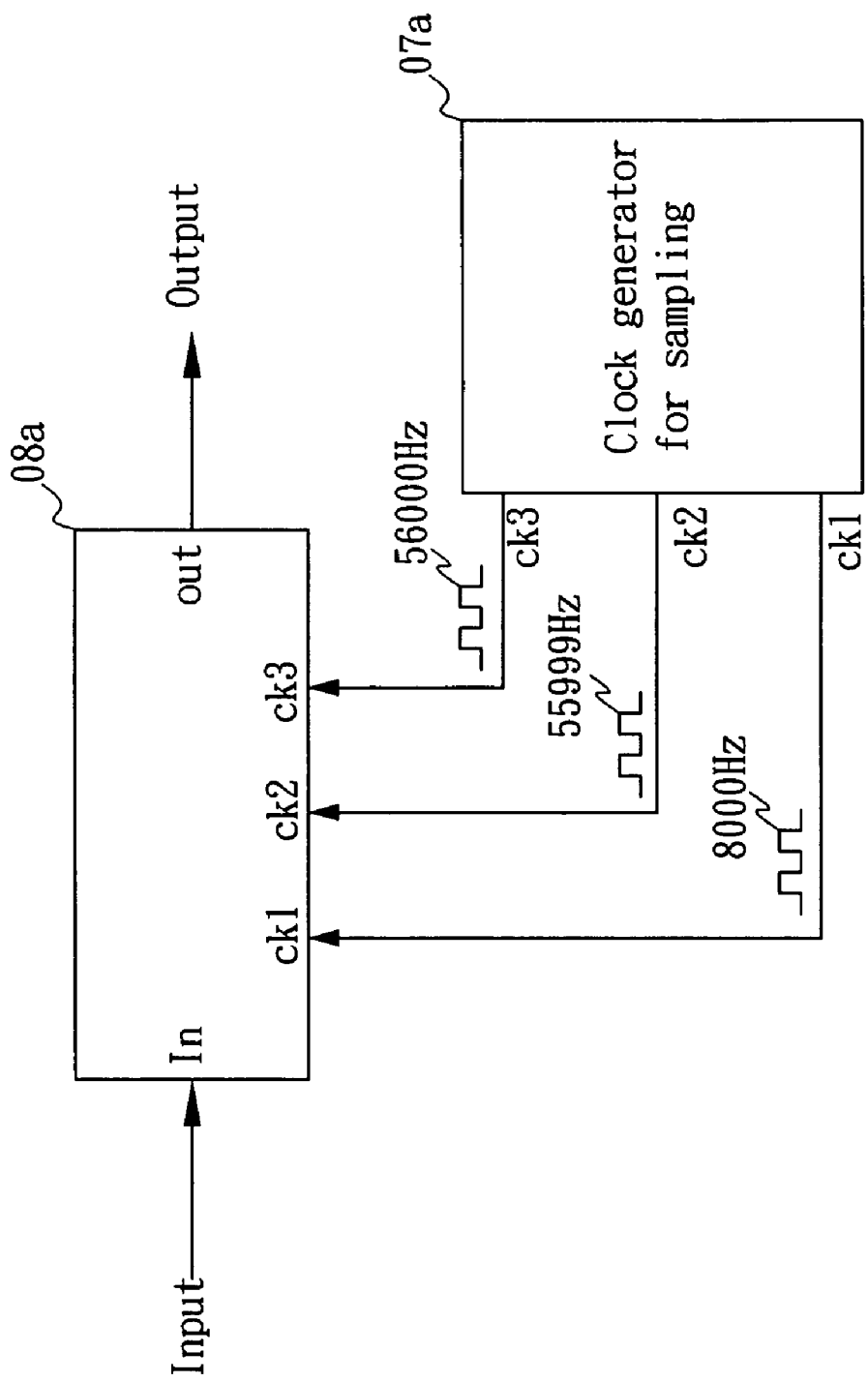

FIG. 17 shows a block diagram of the combination of ideal-like band-pass filter and single-frequency filter according to a preferred embodiment of the present invention.

DETAILED DESCRIPTION

Similar to the conventional filters, the ideal-like band-pass filter and single-frequency filter of the present invention is also characterized in the design of Frequency Response Formula and Phase-Shift Response Formula.

(II) Description of Technique 1

Mated Periodical Square Waves of Frequency Response Formula 1

First, defining a formula for periodical mated square waves as following:

$$he(r, \theta) = \begin{cases} 1 & ; \ 2p\pi - r\pi \leq \theta \leq 2p\pi + r\pi \\ 0 & ; \ \theta = \text{others} \end{cases} \quad (1)\text{-}1$$

wherein, $$0 < r \leq \frac{1}{2}; \rho = 0, \pm 1, \pm 2, \ldots$$

Figure 1:
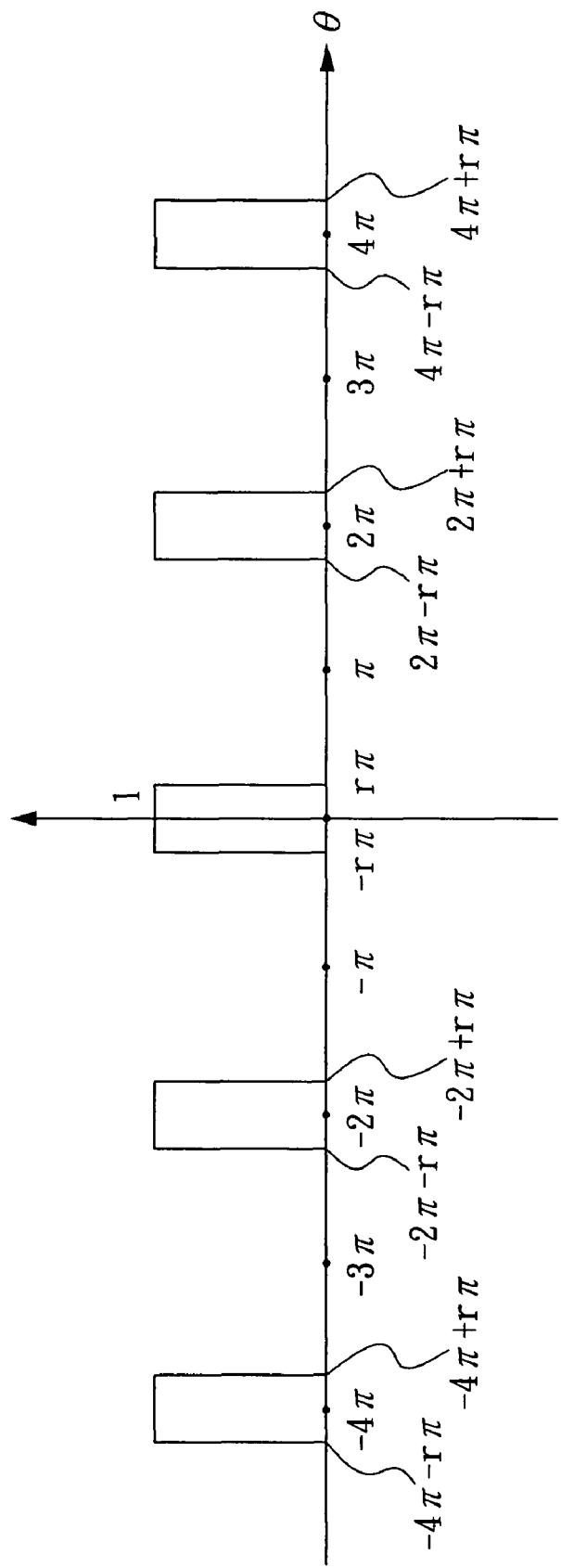
FIG. 1 shows a diagram of wave form obtained based on equation (1)-1 according to the present invention.

The wave form of equation (1)-1 is shown in FIG. 1, which is a formula for periodical mated square waves having a height equal to 1, width equal to 2rπ and period equal to 2π.

Using Fourier transform to extend he(r,θ) to item k+1 (the item having an average value r), and letting it to be hse(k,r,θ), and then obtaining:

$$hse(k, r, \theta) = r + \sum_{u=1}^{k} a_u \cos(k\theta) \quad (1)\text{-}2$$

Wherein,
r is average value; and $$a_u = \frac{2}{k\pi}\sin(2ru\pi).$$

Figure 2:
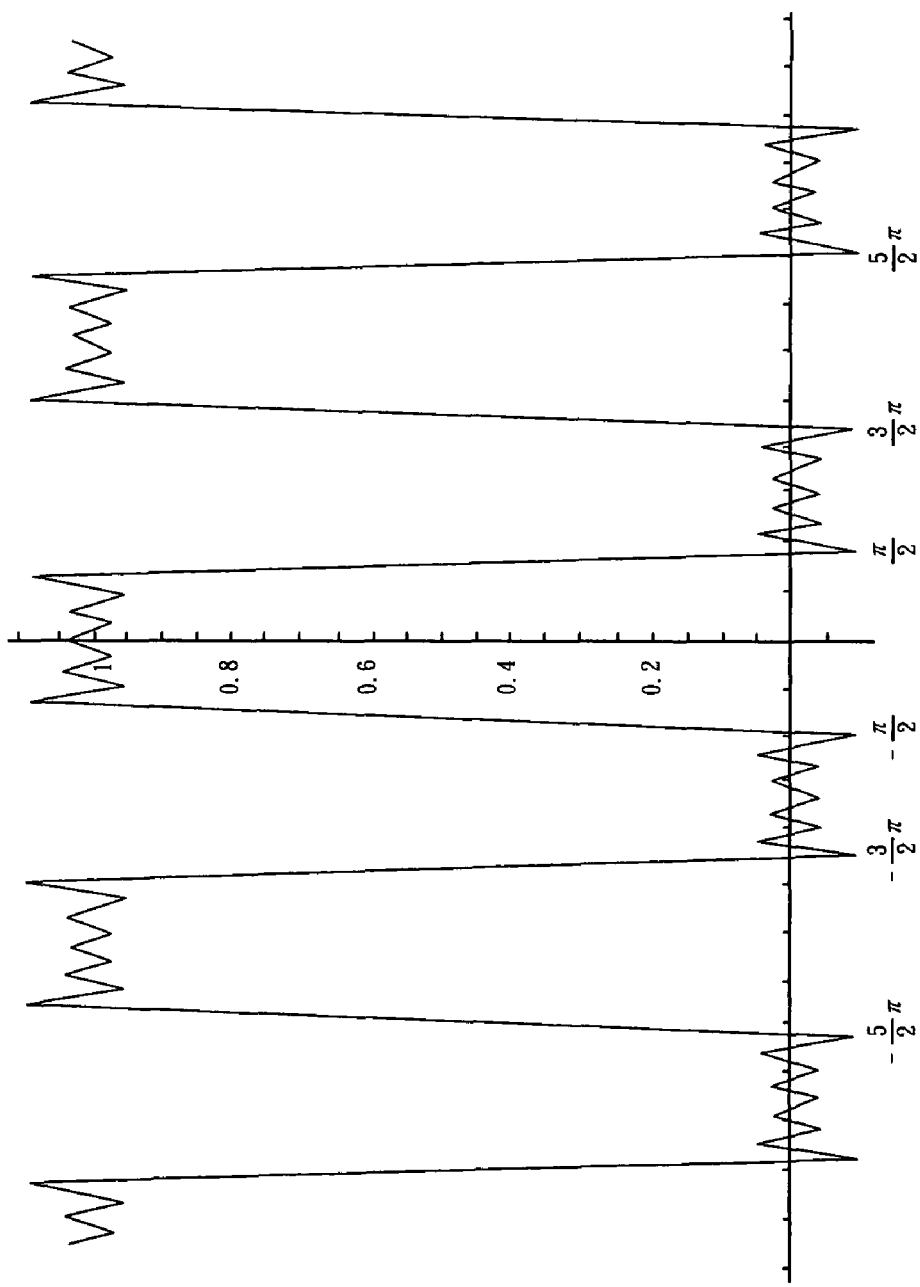
FIG. 2 shows a diagram of wave form obtained based on the function $$hse\left(5, \frac{1}{2}, \theta\right)$$

Hereunder is an example:
In equation (1)-2, if let k=5, $$r = \frac{1}{2},$$

then the figure of $$hs\left(5, \frac{1}{2}, \theta\right)$$

will become the one shown in FIG. 2.

Now, let us calculate the limited series $$hs\left(5, \frac{1}{2}, \theta\right)$$

by using the following steps:
1. Multiplying $$hse\left(5, \frac{1}{2}, \theta\right)$$

by itself for 3 times, that is $$\left[hse\left(5, \frac{1}{2}, \theta\right)\right]^3,$$

and then its wave form will be like the one shown in FIG. 3. It can be seen from FIG. 3 that, when $$2\rho\pi - \frac{1}{2}\pi \leq \theta \leq 2\rho\pi + \frac{1}{2}\pi$$

(wherein, $\rho=0, \pm 1, \pm 2, \ldots$ ), the value thereof is still various near to value 1 of the height. However, in other ranges, the value will become zero much rapidly than which shown in FIG. 2, this is due to the fact that, the absolute value of $$he\left(5, \frac{1}{2}, \theta\right)$$

in said "other ranges" is smaller than 1, and therefore this value will approach to zero rapidly after multiplying by itself for 3 times.

2. Subtracting 1 from $$\left[hse\left(5, \frac{1}{2}, \theta\right)\right]^3, \text{ that is } \left[hse\left(5, \frac{1}{2}, \theta\right)\right]^3 - 1,$$

and the wave form thereof become the one shown in FIG. 4. Under this condition, when θ is belong to the range of $$\left[2\rho\pi - \frac{1}{2}\pi, 2\rho\pi + \frac{1}{2}\pi\right],$$

its value will be various near to zero (absolute value always smaller than 1).

3. Multiplying $$\left[hse\left(5, \frac{1}{2}, \theta\right)\right]^3 - 1$$

by itself for 7 times, that is $$\left\{\left[hse\left(5, \frac{1}{2}, \theta\right)\right]^3 - 1\right\}^7,$$

and then its wave form will be like the one shown in FIG. 5. That is, when θ is in the range of $$\left[2\rho\pi - \frac{1}{2}\pi, 2\rho\pi + \frac{1}{2}\rho\pi\right],$$

its value will approach to zero rapidly.

4. Finally, moving $$\left\{\left[hse\left(5, \frac{1}{2}, \theta\right)\right]^3 - 1\right\}^7$$

upward for one unit, that is $$\left\{\left[hse\left(5, \frac{1}{2}, \theta\right)\right]^3 - 1\right\}^7 + 1,$$

and the wave form thereof become FIG. 6.

Magnifying the wave form of FIG. 6 near the position where θ is in the range of $$\left[2\rho\pi - \frac{1}{2}\pi, 2\rho\pi + \frac{1}{2}\pi\right],$$

and a magnified wave form like FIG. 7 will be obtained. In the mean time, FIG. 8 shows another magnified wave form when θ is outside of the same range.

It can be seen from FIG. 7 and FIG. 8 that, limited series $$\left\{\left[he\left(5, \frac{1}{2}, \theta\right)\right]^3 - 1\right\}^7 + 1$$

is very near to the value of $$he\left(\frac{1}{2}, \theta\right)$$

in the equation (1)-1 when $$r = \frac{1}{2}.$$

The above mentioned 3-times or 7-times self-multiplication is only an example. When the number or self-multiplication increases, the better result will be obtained in approaching $$he\left(\frac{1}{2}, \theta\right),$$

which should depend on the accuracy required.

Generally speaking, we can choose suitable values for variables u, m and n (wherein u, m and n are natural numbers) in the following equation $$\left\{\left[hse\left(u, \frac{1}{2}, \theta\right)\right]^m - 1\right\}^n * \frac{1 + (-1)^{n+1}}{2}$$

in order to obtain desired accuracy.

(III) Description of Technique 2

Mated Periodical Square Waves of Frequency Response Formula 2

Following the above mentioned example, letting:

$$hde(\theta) = \left\{\left[hse\left(5, \frac{1}{2}, \theta\right)\right]^3 - 1\right\}^7 + 1 \quad (2)\text{-}1$$

Because hdr($\theta$) is a mated function, it only contains harmonic cosine signals. Therefore, by extending the above equation according to Cos $\theta \cdot$ Cos $2\theta \cdot \ldots$ Cos($105\theta$), the following equation can be obtained:

$$hde(\theta) = A_0 + \sum_{n=1}^{105}[A_n\text{Cos}(n\theta)] \quad (2)\text{-}2$$

Wherein, $A_n$ (n=0, 1, ... 105) are constants, which are status variables.

Equation (2)-2 is a kind of triangular series. It is not a pure Fourier series now, but is another kind of series which can converge much faster.

Assuming there exists a sine signal $S(\omega,t)$ that:

$$S(\omega,t) = C\,\text{Cos}(\omega t) + D\,\text{Sin}(\omega,t)$$

Now, let sampling rate to be v, and then start sampling $S(\omega,t)$ to get 105 samples before and after the point $t=t_0$, that is, $$S\left(\omega, t_0 - \frac{105}{v}\right),$$
$$S\left(\omega, t_0 - \frac{104}{v}\right), \ldots S\left(\omega, t_0 - \frac{1}{v}\right), S\left(\omega, t_0 + \frac{1}{v}\right),$$
$$S\left(\omega, t_0 + \frac{2}{v}\right), \ldots S\left(\omega, t_0 + \frac{105}{v}\right);$$

and then, perform the following calculation:

$$Sde(\omega, t_0) = A_0 S(\omega, t_0) + \frac{1}{2}\sum_{n=1}^{105} A_n\left[S\left(\omega, t_0 - \frac{n}{v}\right) + S\left(\omega, t_0 + \frac{n}{v}\right)\right] \quad (2)\text{-}3$$

Wherein, $A_n$ is the same as $A_n$ (n=0, 1, 2, ..., 105) of equation (2)-2, because:

$$S\left(\omega, t_0 - \frac{n}{v}\right) + S\left(\omega, t_0 + \frac{n}{v}\right) = C\left[\text{Cos}\left(\omega t_0 - \frac{n}{v}\omega\right) + \text{Cos}\left(\omega t_o + \frac{n}{v}\omega\right)\right]$$
$$+ D\left[\text{Sin}\left(\omega t_0 - \frac{n}{v}\omega\right) + \text{Sin}\left(\omega t_o + \frac{n}{v}\omega\right)\right]$$
$$= 2C\text{Cos}(\omega t_0)\text{Cos}\left(\frac{n}{v}\omega\right) + 2D\text{Sin}(\omega t_0)\text{Cos}\left(\frac{n}{v}\omega\right)$$
$$= 2\text{Cos}\left(\frac{n}{v}\omega\right)[C\text{Cos}(\omega t_0) + D\text{Sin}(\omega t_0)]$$
$$= 2\text{Cos}\left(\frac{n}{v}\omega\right)S(\omega, t_0)$$

Input the above result into equation (2)-3 and get:

$$Sde(\omega, t_0) = S(\omega, t_0)\left[A_0 + \sum_{n=1}^{105} A_n\text{Cos}\left(\frac{n}{v}\omega\right)\right] \quad (2)\text{-}4$$
$$= S(\omega, t_0)hde\left(\frac{\omega}{v}\right)$$

Because $\omega \geqq 0$ in this place, therefore it can be seen from FIG. 6 that, when $$0 \leq \frac{\omega}{v} \leq \frac{\pi}{2} \text{ or when}$$
$$\frac{2i+1}{2} \leq \frac{\omega}{v} \leq \frac{2i+3}{2}\pi (i=1, 2, 3 \ldots ),$$

that is, when $$0 \leq \omega \leq \frac{\pi}{2}v$$

or when $$\frac{2i+1}{2} - \pi v \leq \omega \leq \frac{2i+3}{2}\pi v,$$

the $Sde(\omega, t_0) \rightarrow S(\omega, t_0)$; otherwise, when $\omega$ is not in the above mentioned ranges, then $Sde(\omega, t_0) \rightarrow 0$.

Where $\omega$ is angle-frequency and can be presented by $\omega = 2\pi f$ (where f is frequency). Thereby, it can also be referred as the frequency f of sine signal $S(\omega,t)$. When $$f \in \left[0, \frac{1}{4}v\right] \text{ or } f \in \left[\frac{2i+1}{4}v, \frac{2i+3}{4}v\right],$$

and when $t=t_0$, the result of calculation of equation (2)-3 will almost the same as the original $S(\omega, t_0)$ (same for any $t_0$); however, the result will be near to zero if f is not in the above mentioned range.

From the equation of $Sde(\omega, t_0) \rightarrow S(\omega, t_0)$, it can be seen (or be seen from FIG. 6) that, for any frequency of signal in the range of responsive f (that is, $$f \in \left[0, \frac{1}{4}v\right] \text{ or } f \in \left[\frac{2i+1}{4}v, \frac{2i+3}{4}v\right],$$

where i=1, 2, 3, ... ), the extracted signal not only has an amplitude which is almost constant, but also has a constant delay of time due to calculation for any responsive frequency. Since there is no problem of amplitude variations in different frequencies, therefore there won't be any problem of phase-shifts as well.

As a result, the filter in accordance with the present invention can be considered to be an ideal-like filter.

However, the responsive frequencies thereof are periodical. Based on the aforementioned descriptions, it is understood that the period is corresponding to the sampling rate vHz, and the total range of the responsive frequencies of each period is $$\frac{v}{2} \text{Hz}.$$

For example, as shown in FIG. 9, let v=8000 Hz, such that the period of responsive frequencies will be 8000 Hz. The ranges of responsive frequencies in the first period are 0 Hz~2000 Hz and 6000 Hz~8000 Hz (wherein, the total range of responsive frequencies is 2000 Hz+2000 Hz=4000 Hz, which is equal to a half of 8000 Hz), while the range of unresponsive frequency is 2000 Hz~6000 Hz (wherein, the total range of unresponsive frequencies is also equal to a half of 8000 Hz, that is 4000 Hz). In the second period, The ranges of responsive frequencies are 8000 Hz~10000 Hz and 14000 Hz~16000 Hz (wherein the total range is still 4000 Hz), while the range of unresponsive frequency is 10000 Hz~14000 Hz (also 4000 Hz). Because the same rules can also be applied to the following periods, thereby descriptions thereof will be omitted.

In addition, according to the aforementioned equation (2)-1 and the example of hde(θ), the width between the responsive and unresponsive frequencies (also referred as threshold width hereinafter) is around $10^{-4}$ Tv (where Tv is period and has its unit is Hz) as shown in FIG. 10. Therefore, if Tv=8000 Hz, then its threshold width is around 0.8 Hz. Thereby, the borderlines between responsive and unresponsive frequencies are very clear and definite.

However, no matter what, the above illustrated method for designing filters is still periodical. And, for the example of v=8000 Hz, the width between responsive and unresponsive frequencies is only 4000 Hz, and thus is not practical enough for commercial applications. Therefore, the following description will illustrate a method to extend the period to Mv (where M is a very large number, and v is the basic sampling rate).

(IV) Description of Technique 3

Method to Extend Periods

The following illustration is divided into 3 sections:

Section 1: Compensatory Function

Let $\overline{hde}(\theta) = 1 - hde(\theta)$, and then it can be seen from equation (2)-2 that:

$$\overline{hde}(\theta) = (1 - A_0) - \sum_{n=1}^{105} [A_n \cos(n\theta)] \quad (3)\text{-}1$$

where $\overline{hde}(\theta)$ is referred as the compensatory function of hde(θ) hereinafter.

Similarly, assume there is a sine signal S(ω,t) that:

$S(\omega,t) = C \cos(\omega t) + D \sin(\omega,t)$

And then, start sampling S(ω,t) before and after $t=t_0$ in order to get 105 samples each, and perform the following calculation:

$$\overline{Sde}(\omega, t_0) = (1 - A_0)S(\omega, t_0) - \frac{1}{2}\sum_{n=1}^{105} A_n \left[ S\left(\omega, t - \frac{n}{v}\right) + S\left(\omega, t_0 + \frac{n}{v}\right) \right] \quad (3)\text{-}2$$

And thus we can obtain:

$$\overline{Sde}(\omega, t_0) = S(\omega, t_0)\overline{hde}\left(\frac{\omega}{v}\right) \quad (3)\text{-}3$$

From equation (3)-2, it can be seen that the range between responsive and unresponsive frequencies is like the one shown in FIG. 11, which is right opposite to the figure shown in FIG. 9.

Section 2: Filtering Calculation

In the calculation of equation (2)-3, we can say that it refers to a filtering calculation for signal S(ω,t) and hde(θ) of equation (2)-3 when $t = t_0$ and that the period of responsive frequencies is vHz. Let symbol Fl{S(ω,$t_0$),hde(θ);v} to represent this calculation, and it can be obtained from equation (2)-4 that:

$$Fl\{S(\omega, t_0), hde(\theta); v\} = S(\omega, t_0)hde\left(\frac{\omega}{v}\right) \quad (3)\text{-}5$$

Similarly, in the calculation of equation (3)-2, we can say that it refers to a filtering calculation for signal S(ω,t) and $\overline{hde}(\theta)$ of equation (3)-2 when $t = t_0$ and that the period of responsive frequencies is vHz. Let symbol Fl{S(ω,$t_0$), $\overline{hde}(\theta)$;v} to represent this calculation, and it can be obtained from equation (3)-3 that:

$$Fl\{S(\omega, t_0), \overline{hde}(\theta); v\} = S(\omega, t_0)\overline{hde}\left(\frac{\omega}{v}\right) \quad (3)\text{-}6$$

Assume there is a signal being defined as:

$$f(t) = \sum_{i=1}^{m} S(\omega_i, t) \quad (3)\text{-}7$$

Wherein, $S(\omega_i, t) = C_i \cos(\omega_i t) + D_i \sin(\omega_i t) \quad (3)\text{-}8$ Then we can also define f(t) to perform filtering calculations with hde(θ) or $\overline{hde}(\theta)$ when $t = t_0$ and that the period of responsive frequencies is vHz. And, the symbols Fl{f($t_0$),hde(θ);v} and Fl{f($t_0$),$\overline{hde}(\theta)$;v} are used to represent these two calculations. Base on this definition, the following equations can be obtained easily from equations (3)-5 and (3)-6:

$$Fl\{f(t_0), hde(\theta); v\} = \sum_{i=1}^{m} \left[ S(\omega_i, t_o)hde\left(\frac{\omega_i}{v}\right) \right] \quad (3)\text{-}9$$

$$Fl\{f(t_0), \overline{hde}(\theta); v\} = \sum_{i=1}^{m} \left[ S(\omega_i, t_o)\overline{hde}\left(\frac{\omega_i}{v}\right) \right] \quad (3)\text{-}10$$

Section 3: Method for Extending Periods of Responsive Frequencies

The following two examples are illustrated before introducing the general method.

Example 1

(1) Firstly, perform filtering calculation of $Fl\{f(t_0), hde(\theta); 8000\}$, and the condition of its responsive frequencies will be like the one shown in axis $V_1$ of FIG. 12 (that is, being responsive when the height is 1, and unresponsive when the height is 0).

(2) Secondly, perform calculation of $Fl\{f(t_0), hde(\theta); 12000\}$, and the condition of its responsive frequencies will be like the one shown in axis $V_2$ of FIG. 12.

(3) Thirdly, perform calculation of $Fl\{f(t_0), hde(\theta); 28000\}$, and the condition of its responsive frequencies will be like the one shown in axis $V_3$ of FIG. 12.

(4) Finally, multiply the results of the above three calculations, and let its result to be $G_1(t_0)$, that is:

$$G_1(t_0) = Fl\{f(t_0), hde(\theta); 8000\} Fl\{f(t_0), hde(\theta); 24000\} Fl\{f(t_0), hde(\theta); 56000\}$$

It is obvious that, the condition of the responsive frequencies of $G_1(t_0)$ is like the one shown in axis $V_4$ of FIG. 12. In can be seen from axis $V_4$ that, the signal in the range 0~2000 Hz is responsive at beginning, and then, the next responsive range will directly jump to 46000 Hz~50000 Hz.

(5) The cube root of the calculated $G_1(t_0)$ is $$[G_1(t_0)]^{\frac{1}{3}}.$$

Therefore, signals in $f(t_0)$ having frequencies among 0~2000 Hz will be extracted (the frequencies of next extracted signals will directly jump to 46000 Hz~50000 Hz).

Example 2

(1) Perform filtering calculations for $Fl\{f(t_0), \overline{hde}(\theta); 8000\}$, $Fl\{f(t_0), hde(\theta); 32000\}$ and $Fl\{f(t_0), hde(\theta); 88000\}$ separately, and the conditions of their responsive frequencies will be like axes $V_1$, $V_2$ and $V_3$ of FIG. 13 respectively.

(2) Let the multiplication of these three results of calculations to be $G_2(t_0)$, that is:

$$G_2(t_0) = Fl\{f(t_0), \overline{hde}(\theta); 8000\} Fl\{f(t_0); hde(\theta); 32000\} Fl\{f(t_0); hde(\theta); 88000\}$$

The condition of the responsive frequencies of $G_2(t_0)$ will be like axis $V_4$ of FIG. 13. In can be seen from this axis $V_4$ that, the signal in the range 2000 Hz~6000 Hz is responsive at beginning, and then, the next responsive range will directly jump to 60000 Hz~70000 Hz.

(3) Finally, calculate $$[G_2(t_0)]^{\frac{1}{3}}.$$

Therefore, signals in $f(t_0)$ having frequencies among 2000 Hz~6000 Hz will be extracted (the frequencies of next extracted signals will directly jump to 60000 Hz~70000 Hz).

Example 3

General Method (1) Firstly, let's simplify these mathematic symbols by defining:

$$G_r(t, v) = Fl\{f(t), hde(\theta); v\} \quad (3)\text{-}11$$

$$\overline{G_r}(t, v) = Fl\{f(t), \overline{hde}(\theta); v\} \quad (3)\text{-}12$$

$$G_s(t, v_1 \sim v_m) = \prod_{i=1}^{m} G_r(t, v_i) \quad (3)\text{-}13$$

$$\overline{G_s}(t, u_1 \sim u_m) = \prod_{i=1}^{n} \overline{G_r}(t, u_i) \quad (3)\text{-}14$$

$$GL(t, v_i \sim v_m; u_1 \sim u_m, S) = \begin{cases} GS(t, v_1 \sim v_m); & S = 1 \\ \overline{GS}(t, u_1 \sim u_n); & S = 2 \\ GS(t, v_1 \sim v_m)\overline{GS}(t, u_1 \sim u_m); & S \neq 1, 2 \end{cases} \quad (3)\text{-}15$$

(2) When $v_1 \sim v_m$, $u_1 \sim u_m$ and S are selected, let's firstly perform calculation of equation (3)-15 for $GL(t; v_1 \sim v_m; u_1 \sim u_m; S)$, and then perform one of the following calculations:

(i) when $S = 1$, calculate: $[GL(t; v_1 \sim v_m; u_1 \sim u_m; S)]^{\frac{1}{m}}$ (ii) when $S = 2$, calculate: $[GL(t; v_1 \sim v_m; u_1 \sim u_m; S)]^{\frac{1}{n}}$ (iii) when $S \neq 1, 2$, calculate: $[GL(t; v_1 \sim v_m; u_1 \sim u_m; S)]^{\frac{1}{m+n}}$ (3) It can be seen from the above description that, the beginning frequency of the first range of responsive frequencies and the beginning frequency of the next range of responsive frequencies are both decided by the values of S, $v_1 \sim v_m$ and $u_1 \sim u_m$. And this is the general method to extend the period of responsive frequencies.

(V) Description of Technique 4

Single-Frequency Filter

By using the aforementioned method for extending period of responsive frequencies, the single-frequency filter can also be designed. This method can be described by the following five points.

1. Firstly, perform filtering calculation for $\overline{G_r}(t,v)$ by equation (3)-12, and the condition of its responsive frequencies will be like the one shown in axis $V_1$ of FIG. 14.

2. Select a very small positive value $\epsilon$, and then perform filtering calculation for $\overline{G_r}(t, 7v - 2\epsilon v)$, and the condition of its responsive frequencies will be like the one shown in axis $V_2$ of FIG. 14.

3. Then, perform filtering calculation for $G_r(t, 7v)$ by using equation (3)-11, and the condition of its responsive frequencies will be like the one shown in axis $V_3$ of FIG. 14.

4. Select $S=3$ (now $S \neq 1,2$), and then perform calculation for $GL(t, 7v; v, 7v - 2\epsilon v, 3)$ by equation (3)-15, and then, the beginning frequency of its responsive frequencies will be $\left(\frac{7}{4} - \varepsilon\right) v Hz,$ the width will be $\varepsilon$Hz; and the next/second responsive frequencies will start from $\left(\frac{35}{4} - 3\varepsilon\right) v Hz$ with a width of 3 $\varepsilon$Hz. The condition of its responsive frequencies will be like the one shown in axis $V_4$ of FIG. 14.

5. Calculations:

$[GL(t, 7v; v, 7v - 2\varepsilon v, 3)]^{\frac{1}{3}}$

And the result of calculation is that, at beginning, the signals contained in f(t) having a frequency in the range of $\left(\frac{7}{4} - \varepsilon\right) v Hz \sim \frac{7}{4} v Hz$ will be extracted, and then, the next range of the extracted signals will directly jump to the frequencies between $\left(\frac{35}{4} - 3\varepsilon\right) v Hz \sim \frac{35}{4} v Hz.$ No matter what is the value of v, we only need to select $\varepsilon$ in order to make $\varepsilon v = 1$, and then the beginning frequency of the first range of extracted signals will be 1 Hz. And this is so called single-frequency filter.

(VI) Description of Technique 5

Filter Using Analog Calculations

The filters mentioned above, no matter band-pass filters or single frequency filters, all need to sample the signals to be filtered before performing the calculations, and thus the range of responsive frequencies are also directly corresponding to the sampling rate of signals.

However, if the frequency of signals to be filtered is extremely high and even higher than the sampling rate of conventional A/D converters, then the calculating methods described above will not be suitable for achieving the objectives of the present invention. For example, the carrier frequencies used in microwave communications are counted by GHz units, however, currently there is no such technology to produce A/D converters with sampling rates in GHz.

Here is a method to resolve the problem of extremely high sampling rates of A/D converters. The descriptions of such novel method is divided in three sections as follows:

(1) Euler-Maclaurin Formula:

Assuming f(t) is continuous in t∈[a,b], and all its sub-order values exist, then:

$$\frac{b-a}{m} \sum_{i=0}^{m-1} f\left(a + i\frac{b-a}{m}\right) = \quad (6)\text{-}1\text{-}1$$

$$\int_a^b f(x)dx - \frac{b-a}{2m}[f(b) - f(a)] + R\left(\frac{m}{b-a}, L\right)$$

or                                                                                                (6)-1-2

$$\frac{b-a}{m} \sum_{i=0}^{m-1} f\left(a + i\frac{b-a}{m}\right) =$$

$$\int_a^b f(x)dx + \frac{b-a}{2m}[f(b) + f(a)] + R\left(\frac{m}{b-a}, L\right)$$

wherein:

$$R\left(\frac{m}{b-a}, L\right) = \quad (6)\text{-}2$$

$$\lim_{L \to \infty} \sum_{i=1}^{L} \left\{(-1)^{i+1}\left(\frac{b-a}{m}\right)^{2i} \frac{B(2i)}{2i}[f^{(2i-1)}(b) - f^{(2i-1)}(a)]\right\}$$

wherein B(2i) is a Bernoulli value.

Either equation (6)-1-1 or equation (6)-1-2 will be Euler-Maclaurin Formula.

In the above equations, $$\frac{b-a}{m}$$

is the distance between any two samples of signals obtained when f(t) is in t∈[a,b], and thus it is a reciprocal of sampling rate $v_0$, that is:

$$\frac{1}{v_0} = \frac{b-a}{m} \quad (6)\text{-}3$$

Therefore, equations (6)-1-1, (6)-1-2 and (6)-2 can be rewritten into:

$$\sum_{i=0}^{m-1} f\left(a + \frac{i}{v_0}\right) = v_0 \int_a^b f(x)dx - \frac{1}{2}[f(b) - f(a)] + v_0 R(v_0, L) \quad (6)\text{-}4\text{-}1$$

or                                                                                                (6)-4-2

$$\sum_{i=0}^{m} f\left(a + \frac{i}{v_0}\right) = v_0 \int_b^a f(x)dx + \frac{1}{2}[f(b) + f(a)] + v_0 R(v, L)$$

$$R(v_0, k) = \lim_{L \to \infty} \sum_{i=1}^{L} \left\{(-1)^{i+1}\left(\frac{1}{v_0}\right)^{2i} \frac{B(2i)}{(2i)!}[f^{(2i-1)}(b) - f^{(2i-1)}(a)]\right\} \quad (6)\text{-}5$$

(2) Coefficient Functions of Frequency Response Formulas:

The functions represented by equations (1)-2 and (2)-2 are frequency response formulas (both mated). Wherein equation (1)-2 is an original function before transformation, and equation (2)-2 is a function transformed by decreasing the number of selected grades and then self-multiplying it for two times (one for 3 times and one for 7 times). The values r, $a_u$ (u=1, 2, ... ) and $A_n$ (n=0, 1, 2 ... ) of equations (1)-2 and (2)-2 are all coefficients. Because these coefficients are all related to their locations (e.g., u and n), and are all members of the frequency response formulas, and thus are called as coefficient functions of frequency response formulas (also referred as CFFRF hereinafter).

CFFRF can be described in mathematic formulas. Firstly, the mathematic formula of CFFRF of equation (1)-2 is described.

Let's change the variable u shown in equation (1)-2 into variable n, and rewrite the equation as below:

$$hse(k, r, \theta) = r + \sum_{n=1}^{k} a_n \cos(n\theta) \quad (1)\text{-}2$$

Let $\alpha(0) = r$, $\alpha(n) = \frac{1}{2}a_n$ and $\alpha(-n) = \frac{1}{2}a_n$, and then equation (1)-2 can be rewritten into:

$$hse(k, r, \theta) = \sum_{n=-k}^{k} a(n)\cos(n\theta) \quad (6)\text{-}6$$

wherein, $\alpha(0)$ is the average value of one period shown in FIG. 1, and the value $\alpha(n)$ will be:

$$\alpha(n) = \frac{1}{2}a_n = \frac{1}{n\pi}\sin(rn\pi) \quad (6)\text{-}6\text{-}1$$

In equation (6)-6, when $k \to \infty$, the wave form will become the one shown in FIG. 1. Wherein, if the value k is big enough, then the wave form will be close to the one shown in FIG. 1.

The value $\alpha(0)$ can be rewritten into:

$$\alpha(0) = \frac{1}{2\pi}\int_{-r\pi}^{r\pi} dx \quad (6)\text{-}6\text{-}2$$

wherein, equations (6)-6-1 and (6)-6-2 are the CFFRF of equation (1)-2.

Secondly, the mathematic formula of CFFRF of equation (2)-2 is discussed. Let $$A(0) = A_0, A(n) = \frac{1}{2}A_n \text{ and } A(-n) = \frac{1}{2}A_n, \text{ and}$$

then equation (2)-2 can be rewritten into:

$$hde(\theta) = \sum_{n=-105}^{105}[A(n)\cos(n\theta)] \quad (6)\text{-}7$$

because $\quad (6)\text{-}8$ $$\frac{1}{2\pi}\int_{-\pi}^{\pi}\cos(nx)\cos(mx)dx = \begin{cases} 1; & n = m \\ 0; & n \neq m \end{cases}$$

therefore:

$$A(n) = \frac{1}{2\pi}\int_{-\pi}^{\pi} hde(x)\cos(nx)dx$$

wherein, equation (6)-8 is the mathematic formula of CFFRF of equation (6)-7.

(3) Analog Calculation Equivalent to Digital Calculation:

Assume there is a sine signal $S(\omega,t) = C\cos(\omega t) + D\sin(\omega,t)$ Let's take $t = t_i$ to be the original point, and then obtain k samples to $S(\omega,t)$ before and after the original point by using the sampling rate v, that is, totally 2k+1 samples will be obtained including the sample $S(\omega,t_i)$ when $t = t_i$. Then, performing the following calculation:

$$SD_1(\omega, t_i) = r \cdot S(\omega, t_i) + \frac{1}{2}\sum_{n=1}^{k}a_n\left[S\left(\omega, t_i - \frac{n}{v}\right) + S\left(\omega, t_i + \frac{n}{v}\right)\right] \quad (6)\text{-}9$$

According to the description illustrated in the section of "(III) Description of Technique 2", the equation (6)-9 can be transformed into:

$$SD_1(\omega, t_i) = S(\omega, t_i)hse\left(k, r, \frac{n}{v}\right) \quad (6)\text{-}10$$

It can be seen from the definition of hse(k,r,θ) according to equation (1)-2 that, if the number of grades taken for k is large enough to let the value of hse(k,r,θ) similar to the value of he(r,θ) (wherein the definition of he(r,θ) is based on equation (1)-1), and then, when $$2\rho\pi - r\pi \leq \frac{\omega}{v} \leq 2\rho\pi + r\pi \text{ or } v(2\rho\pi - r\pi) \leq \omega \leq v(2\rho\pi + r\pi),$$

the value of $S(\omega,t_i)$ can be extracted, otherwise it will be cut off.

It also can be seen from aforementioned $\alpha(0) = r$ and $$\alpha(n) = \alpha(-n) = \frac{1}{2}a_n$$

(based on equation (6)-6-1) that, equation (6)-9 can also be transformed into:

$$SD_1(\omega, t_i) = \sum_{n=-k}^{k}\left[\alpha(n)S\left(\omega, t_i + \frac{n}{v}\right)\right]$$

Let's rewrite the above equation by changing the starting point of symbol "Σ" to "0":

$$SD_1(\omega, t_i) = \sum_{n=0}^{2k}\left[\alpha(n-k)S\left(\omega, t_i + \frac{n-k}{v}\right)\right] \quad (6)\text{-}11$$

And let:

$$Y_1(n) = \alpha(n-k)S\left(\omega, t_i + \frac{n-k}{v}\right),$$

therefore, it can be obtained by equation (6)-4-2 that:

$$SD_1(\omega, t_i) = \sum_{n=0}^{2k} Y_1(n) \qquad (6)\text{-}12$$

$$= \int_0^{2k} Y_1(x)dx + \frac{1}{2}[Y(2k) + Y(0)] + R_1(1, L)$$

Because:

$$\int_0^{2k} Y_1(x)dx = \int_0^{2k} \alpha(x-k)S\left(\omega, t_i + \frac{x-k}{v}\right)dx$$

$$= \int_{-k}^{k} \alpha(x)S\left(\omega, t_i + \frac{x}{v}\right)dx$$

$$= \int_{-k}^{k} \alpha(-x)S\left(\omega, t_i - \frac{x}{v}\right)dx$$

It is understood by equation (6)-6-1 that $\alpha(x)=\alpha(-x)$, and thereby:

$$\int_0^{2k} Y_1(x)dx = \int_{-k}^{k} \alpha(x)S\left(\omega, t_i - \frac{x}{v}\right)dx$$

$$= v\int_{-\frac{k}{v}}^{\frac{k}{v}} \alpha(vx)S(\omega, t_i - x)dx$$

If the value $t_i$ in the above equation is replaced by value t, and put the result back to equation (6)-12, then the following equation is obtained:

$$SD_1(\omega, t) = \qquad (6)\text{-}13$$

$$v\int_{-\frac{k}{v}}^{\frac{k}{v}} \alpha(vx)S(\omega, t-x)dx + \frac{1}{2}[Y_1(2k) + Y_1(0)] + R_1(1, L)$$

wherein:

$$Y_1(2k) = \alpha(k)S\left(\omega, t + \frac{k}{v}\right)$$

$$Y_1(0) = \alpha(k)S\left(\omega, t - \frac{k}{v}\right)$$

$$R_1(1, L) = \lim_{L\to\infty} \sum_{i=1}^{L} \left\{(-1)^{i+1} \frac{B(2i)}{(2i)!} [Y_1^{(2i-1)}(2k) - Y_1^{(2i-1)}(0)]\right\}$$

The integration at right side of equation (6)-13 is the Convolution integration of values $\alpha(vt)$ and $S(\omega,t)$ within the range of $$\left[-\frac{k}{v}, \frac{k}{v}\right].$$

The calculation performed for the right side of equation (6)-13 is an analog calculation, which is equivalent to the digital calculation performed for the right side of equation (6)-9.

When the angle-frequency of $S(\omega,t)$ is extremely high and the sampling rate of A/D converter cannot match such speed, then the analog calculation of the right side of equation (6)-13 can be used for calculation.

At beginning, if the following equation is used for calculation instead of equation (6)-9:

$$SD_2(\omega, t_i) = A_0 S(\omega, t_i) + \frac{1}{2}\sum_{n=1}^{105} A_n\left[S\left(\omega, t_i - \frac{n}{v}\right) + S\left(\omega, t_i + \frac{n}{v}\right)\right] \qquad (6)\text{-}14$$

Thereby, it can be determined that:

$$SD_2(\omega, t_i) = \qquad (6)\text{-}15$$

$$v\int_{-\frac{105}{v}}^{\frac{105}{v}} A(vx)S(\omega, t-x)dx + \frac{1}{2}[Y_2(210) - Y_2(0) + R_2(1, L)]$$

Wherein:
A(vx) is the definition defined in equation (6)-8;

$$Y_2(210) = A(105)S\left(\omega, t + \frac{105}{v}\right)$$

$$Y_2(0) = A(105)S\left(\omega, t - \frac{105}{v}\right)$$

$$R_2(1, L) = \lim_{j=1}^{L}\sum_{i=1}^{L}\left\{(-1)^{i+1}\frac{B(2i)}{(2i)!}[Y_2^{(2i-1)}(210) - Y_2^{(2i-1)}(0)]\right\}$$

$$Y_2(x) = A(x - 105)S\left(\omega, t + \frac{x - 105}{v}\right)$$

Finally, if let:

$$F(t) = \sum_{j=1}^{m} S(\omega_j, t)$$

then we can use the value F(t−x) shown above to replace the value $S(\omega,t-x)$ shown in either equation (6)-13 or equation (6)-15 so as to achieve the objective of ideal-like analog band-pass filter according to the present invention.

The mathematic formula of the digital band-pass filter as described above is:

$$a_0 F(t) + \frac{1}{2}\sum_{n=1}^{k} a_n\left[F\left(t - \frac{n}{v}\right) + F\left(t + \frac{n}{v}\right)\right] =$$

$$v\int_{-\frac{k}{v}}^{\frac{k}{v}} \alpha(vx)F(t-x)dx + \frac{1}{2}[Y(2k) + Y(0)] + R(v, L)$$

wherein, $Y(x) = \alpha(vx)F(t-x)$ $$R(v, L) = \lim_{L\to\infty}\sum_{i=1}^{L}\left\{(-1)^{i+1}\left(\frac{1}{v}\right)^{2i}\frac{B(2i)}{2i}[Y^{2i-1}(2k) - Y^{(2i-1)}(0)]\right\}$$

Wherein, $\alpha(x)$ is a coefficient function obtained by Fourier transformation of a periodical function of mated square-wave signal, wherein:

$$\alpha(0) = a_0$$

$$\alpha(n) = \alpha(-n) = \frac{1}{2}a_n$$

In addition, because F(t) is a sine function, therefore the aforementioned values $R_1(1,L)$ and $R_2(1,L)$ must be convergence values, and its accuracy can be determined by the value of L. Generally speaking, when L=10, then the error will be less than ±0.1%.

(VII) Description of Preferred Embodiments

1. Embodiment of Band-Pass Filter

Consider axes $V_1$, $V_2$ and $V_3$ shown in FIG. 13 to be the examples of this embodiment, whose periods of responsive frequencies are 8000 Hz, 16000 Hz and 44000 Hz respectively.

FIG. 15 and FIG. 16 are block diagrams of the circuitries of this embodiment, which are illustrated in the following points:

(1) In FIG. 15, the dotted line represents a filter 01 of the present invention in which the period of responsive frequencies is vHz (where v has three kinds of values and will be illustrated in FIG. 16). Wherein, the calculator 010 is for performing filtering calculation for f(t) and hde(θ) or $\overline{hde}$(θ) when the period of responsive frequencies is vHz; and the memory 011 is for storing parameters $A_0 \sim A_{105}$ for calculations of equation (2)-2 or equation (3)-1.

(2) FIG. 16 illustrates the block diagrams of the whole band-pass filter 08 of the present invention, which can be illustrated by the following points:

(i) The end "In" is the input of signals f(t) which are going to be filtered; and the end "out" is the output of filtered signals.

(ii) Each of the filters 01-1, 01-2 and 01-3 is the same as the filter 01 of FIG. 15. However, the period of responsive frequencies of filter 01-1 is 8000 Hz, the period of filter 01-2 is 16000 Hz, and the period of filter 01-3 is 44000 Hz.

(iii) The blocks 02-1, 02-2 and 02-3 are A/D converters, where $CK_1$, $CK_2$ and $CK_3$ are their inputs of signals for sampling, and their sampling rates are 8000 Hz, 16000 Hz and 44000 Hz respectively.

(iv) The blocks 03-1, 03-2 and 03-3 are sampling memories for temporarily storing the digital data transformed by A/D converters 02-1, 02-2 and 02-3 respectively.

(v) The block 04 is a multiplier for multiplying the calculated results of the filters 01-1, 01-2 and 01-3.

(vi) The block 05 is a cubic root calculator for calculating the cubic root of the result of the multiplier 04.

(vii) The block 06 is a D/A converter for converting the digital signals of calculated result of the calculator 05 into analog signals for output.

(viii) The block 07 is a clock generator for generating clock signals with frequencies of 8000 Hz, 16000 HZ and 44000 Hz for sampling purposes.

(ix) The area 08 defined by dotted lines is a primary circuit block in accordance with the present embodiment, that is, a filter combination.

The above description is an illustration of an embodiment of the band-pass filter in accordance with the present invention.

2. Embodiment of Single-Frequency Filter

FIG. 17 is a block diagram of the circuitries of this embodiment, which are illustrated in the following points:

(i) Firstly, select $$\varepsilon = \frac{1}{8000} \text{ Hz}$$

and v=8000 Hz for FIG. 14, as a result, the periods of responsive frequencies of axes $V_1$, $V_2$ and $V_3$ shown in FIG. 14 will be 8000 Hz, 55999 Hz and 56000 Hz respectively.

(ii) The block 07a in FIG. 17 is a clock generator which is similar with the clock generator 07 shown in FIG. 16. However, the clock generator 07a in this embodiment will generate clock signals having frequencies 8000 Hz (output from $CK_1$), 55999 Hz (output from $CK_2$) and 56000 Hz (output from $CK_3$).

(iii) The block 08a is a filter similar to the band-pass filter 08 shown in FIG. 16. However, the periods of responsive frequencies of the filters in this embodiment are 8000 Hz, 55999 Hz and 56000 Hz, which are different from the ones shown in FIG. 16.

(iv) It is obvious that, the output signal of the end "out" of the filter 08a will have a beginning frequency of 13999 Hz~14000 Hz, and then the next range of frequency which is passable from the end "out" will jump to 69997 Hz~70000 Hz directly (it can be referred to FIG. 14 when v is 8000 and ε is $$\frac{1}{8000}).$$

The above description is an illustration of an embodiment of the single-frequency filter in accordance with the present invention.

Because the detailed layout of circuitries of each block of these two embodiments are known by ordinary people skilled in the art, and thus no further descriptions for these blocks are provided herewith.

In addition, according to the embodiments of equations (6)-13 and (6)-15, the only difference is to use analog calculations in stead of digital calculations previously described. Because the circuits used for such analog calculations can be realized by ordinary persons skilled in the art according to the embodiments previously illustrated in the present invention, no further descriptions will be provided herein.

The preferred embodiments of the invention have been disclosed above, which however should not be construed as a limitation on the actual application of the invention. Hence all modifications and alterations made by those familiar with the skill without departing from the spirits of the invention and appended claims shall remain within the protected scope of the invention.

What is claimed is:

1. A filter for filtering communication signals, comprising:
an input unit for accepting an input signal which can be expressed with a mathematical formula f(t);
a filter combination which further comprising a plurality of filters, each filter being able to generate a control signal and perform a signal filtering process based on the control signal, the control signal being expressed with a mathematical formula hde(θ); wherein, the filter combination processes the input signal based on a set of a plurality of control signals by means of the following formula:

$$GL(t, v_1 \sim v_m; u_1 \sim u_n, S) = \begin{cases} GS(t, v_1 \sim v_m); & S = 1. \\ \overline{GS}(t, u_1 \sim u_n); & S = 2. \\ GS(t, v_1 \sim v_m)\overline{GS}(t, u_1 \sim u_n); & S \neq 1, 2.; \end{cases}$$

(i) when S=1, calculate:

$$[GL(t; v_1 \sim v_m; u_1 \sim u_n; S)]^{\frac{1}{m}};$$

(ii) when S=2, calculate:

$$[GL(t; v_1 \sim v_m; u_1 \sim u_n; S)]^{\frac{1}{n}};$$

(iii) when S≠1,2, calculate:

$$[GL(t; v_1 \sim v_m; u_1 \sim u_n; S)]^{\frac{1}{m+n}};$$

wherein, $G_r(t,v)=Fl\{f(t),hde(\theta); v\}$;

$$\overline{G_r}(t,v)=Fl\{f(t),\overline{hde(\theta)};v\};$$

$$G_s(t, v_1 \sim v_m) = \prod_{i=1}^{m} G_r(t, v_i);$$

$$\overline{G_s}(t, u_1 \sim u_m) = \prod_{i=1}^{n} \overline{G_r}(t, u_i);$$

wherein, $v_1 \sim v_m$ and $u_1 \sim u_n$ are practice values for v of each filter of the filter combination, $\overline{hde}(\theta)=1-hde(\theta)$; and an output unit for outputting an output signal which can be expressed with the mathematical formula $GL(t,v_1 \sim v_m; u_1 \sim u_n, S)$.

2. The filter of claim 1, wherein:

$$hde(\theta) = A_0 + \sum_{n=1}^{k} [A_n \cos(n\theta)];$$

$A_n$ (n=0, 1, . . . , k; where k is a positive integral) is a constant;

the filter can perform signal processes to a sine signal $S(\omega,t)$ by means of the following formula:

$$Sde(\omega, t_0) = S(\omega, t_0)\left[A_0 + \sum_{n=1}^{k} A_n \cos\left(\frac{n}{v}\omega\right)\right]$$

$$= S(\omega, t_0) hde\left(\frac{\omega}{v}\right)$$

$$= Fl\{S(\omega, t_0), hde(\theta); v\};$$

wherein, the value of $A_n$ of the above equation is equal to the value of $A_n$ of $hde(\theta)$, in addition, $$v = \frac{\omega}{\theta},$$

and θ is a constant.

3. The filter of claim 2, wherein the constant value of $A_n$ can be obtained by means of calculation using the following steps:

firstly, generating a mated square-wave signal having a period of $2\pi$ and height of 1, the mated square-wave signal being mathematically represented by the following equation:

$$he(r, \theta) = \begin{cases} 1 & ; \quad 2p\pi - r\pi \le \theta \le 2p\pi + r\pi \\ 0 & ; \quad \theta = \text{others} \end{cases} \quad (1)\text{-}1$$

wherein, $$0 < r \le \frac{1}{2};$$

$\rho$=0, ±1, ±2, . . . ;

secondly, using Fourier transform to extend he(r,θ) to item k+1 (i.e., the item having an average value r), and letting it to be hse(k,r,θ), and then obtaining:

$$hse(k, r, \theta) = r + \sum_{u=1}^{k} a_u \cos(k\theta); \quad (1)\text{-}2$$

wherein, r is average value, and $$a_u = \frac{2}{k\pi}\sin(2ru\pi);$$

thirdly, letting $$k = 5, r = \frac{1}{2},$$

and inputting them into equation (1)-2, and then letting:

$$hde(\theta) = \left\{\left[hse\left(5, \frac{1}{2}, \theta\right)\right]^3 - 1\right\}^7 + 1;$$

therefore, the constant value of $A_n$ of $hde(\theta)$ being obtained.

4. The filter of claim 1, wherein a calculation of GL(t;7v; v,7v−2εv;3) can be achieved by performing filtering calculations of $\overline{G_r}(t,v)$, $\overline{G_r}(t,7v-2\epsilon v)$ and $\overline{G_r}(t,7v)$; when εv=1, the calculation of GL(t;7v;v,7v−2εv;3) is a single-frequency filter.

5. The filter of claim 4, wherein the filter can perform signal processes to the input signal f(t) by using the following mathematic function:

$$Fl\{f(t_0), hde(\theta); v\} = \sum_{i=1}^{m} \left[S(\omega_i, t_o)hde\left(\frac{\omega_i}{v}\right)\right];$$

wherein,

-continued $$f(t) = \sum_{i=1}^{m} S(\omega_i, t).$$

6. A method for filtering communication signals, comprising:
using an input unit to accept an input signal, the input signal can be expressed by a mathematical formula f(t);
using a filter combination for generating a set of a plurality of control signals, and performing a signal filtering process based on the control signals; the control signals being expressed with a mathematical formula hde(θ); wherein, the filter combination processes the input signal based on the control signals by means of the following formula:

$$GL(t, v_1 \sim v_m; u_1 \sim u_n, S) = \begin{cases} GS(t, v_1 \sim v_m); & S = 1 \\ \overline{GS}(t, u_1 \sim u_n); & S = 2 \\ GS(t, v_1 \sim v_m)\overline{GS}(t, u_1 \sim u_n); & S \neq 1, 2; \end{cases}$$

(i) when S=1, calculate:

$$[GL(t; v_1 \sim v_m; u_1 \sim u_n; S)]^{\frac{1}{m}};$$

(ii) when S=2, calculate:

$$[GL(t; v_1 \sim v_m; u_1 \sim u_n; S)]^{\frac{1}{n}};$$

(iii) when S≠1,2, calculate:

$$[GL(t; v_1 \sim v_m; u_1 \sim u_n; S)]^{\frac{1}{m+n}};$$

wherein, $$G_r(t, v) = Fl\{f(t), hde(\theta); v\};$$

$$\overline{G_r}(t, v) = Fl\{f(t), \overline{hde}(\theta); v\};$$

$$G_s(t, v_1 \sim v_m) = \prod_{i=1}^{m} G_r(t, v_i);$$

$$\overline{G_s}(t, u_1 \sim u_n) = \prod_{i=1}^{n} \overline{G_r}(t, u_i);$$

wherein, $v_1 \sim v_m$ and $u_1 \sim u_n$ are practice values for v of each filter of the filter combination, $\overline{hde}(\theta) = 1 - hde(\theta)$; and
using an output unit for outputting an output signal which can be expressed with the mathematical formula $GL(t, v_1 \sim v_m; u_1 \sim u_n, S)$.

7. The method of claim 6, wherein:

$$hde(\theta) = A_0 + \sum_{n=1}^{k} [A_n \cos(n\theta)];$$

$A_n$ (n=0, 1, . . . , k; where k is a positive integral) is a constant;

the filter can perform signal processes to a sine signal $S(\omega,t)$ by means of the following formula:

$$Sde(\omega, t_0) = S(\omega, t_0)\left[A_0 + \sum_{n=1}^{k} A_n \cos\left(\frac{n}{v}\omega\right)\right]$$

$$= S(\omega, t_0)hde\left(\frac{\omega}{v}\right)$$

$$= Fl\{S(\omega, t_0), hde(\theta); v\};$$

wherein, the value of $A_n$ of the above equation is equal to the value of $A_n$ of hde(θ), in addition, $$v = \frac{\omega}{\theta},$$

and θ is a constant.

8. The method of claim 7, wherein the constant value of $A_n$ can be obtained by means of calculation using the following steps:
firstly, generating a mated square-wave signal having a period of 2π and height of 1, the mated square-wave signal being mathematically represented by the following equation:

$$he(r, \theta) = \begin{cases} 1 & ; \quad 2p\pi - r\pi \leq \theta \leq 2p\pi + r\pi \\ 0 & ; \quad \theta = others \end{cases} \quad (1)\text{-}1$$

wherein, $$0 < r \leq \frac{1}{2}; p = 0, \pm 1, \pm 2, \ldots ;$$

secondly, using Fourier transform to extend he(r,θ) to item k+1 (i.e., the item having an average value r), and letting it to be hse(k,r,θ), and then obtaining:

$$hse(k, r, \theta) = r + \sum_{u=1}^{k} a_u \cos(k\theta); \quad (1)\text{-}2$$

wherein, r is average value, and $$a_u = \frac{2}{k\pi}\sin(2ru\pi);$$

thirdly, letting k=5, $$r = \frac{1}{2},$$

and inputting them into equation (1)-2, and then letting:

$$hde(\theta) = \left\{\left[hse\left(5, \frac{1}{2}, \theta\right)\right]^3 - 1\right\}^7 + 1;$$

therefore, the constant value of $A_n$ of hde(θ) being obtained.

9. The method of claim 6, wherein a calculation of GL(t; 7v;v,7v−2εv;3) can be achieved by performing filtering calculations of $\overline{G_r}(t,v)$, $\overline{G_r}(t,7v-2\epsilon v)$ and $G_r(t,7v)$; when εv=1, the calculation of GL(t;7v;v,7v−2εv;3) is a single-frequency filter.

10. The method of claim 9, wherein the filter combination can perform signal processes to the input signal f(t) by using the following mathematic function:

$$Fl\{f(t_0), hde(\theta); v\} = \sum_{i=1}^{m} \left[ S(\omega_i, t_0) hde\left(\frac{\omega_i}{v}\right) \right];$$

wherein, $$f(t) = \sum_{i=1}^{m} S(\omega_i, t).$$

* * * * *